(12) United States Patent
Sochor

(10) Patent No.: US 8,373,430 B1
(45) Date of Patent: Feb. 12, 2013

(54) LOW INDUCTANCE CONTACT PROBE WITH CONDUCTIVELY COUPLED PLUNGERS

(76) Inventor: Jerzy Roman Sochor, Sunnyvale, CA (US)

( * ) Notice: Subject to any disclaimer, the term of this patent is extended or adjusted under 35 U.S.C. 154(b) by 0 days.

(21) Appl. No.: 13/465,014

(22) Filed: May 6, 2012

(51) Int. Cl.
*G01R 1/067* (2006.01)
*H01R 12/00* (2006.01)
*H01R 43/16* (2006.01)

(52) U.S. Cl. ......... 324/755.05; 324/755.01; 324/755.11; 439/66; 29/874

(58) Field of Classification Search ............. 324/755.01, 324/755.04–755.11; 439/66; 29/874
See application file for complete search history.

(56) References Cited

U.S. PATENT DOCUMENTS

| | | | |
|---|---|---|---|
| 6,462,567 B1 * | 10/2002 | Vinther et al. | 324/754.14 |
| 6,769,919 B2 * | 8/2004 | Kosmala | 439/66 |
| 7,025,602 B1 * | 4/2006 | Hwang | 439/66 |
| 7,250,754 B2 * | 7/2007 | Godkin | 324/207.24 |
| 7,256,593 B2 * | 8/2007 | Treibergs | 324/754.05 |
| 7,677,901 B1 * | 3/2010 | Suzuki et al. | 439/66 |
| 7,772,865 B2 * | 8/2010 | Tan | 324/762.02 |
| 7,841,864 B2 * | 11/2010 | Hsiao et al. | 439/66 |
| 7,946,855 B2 * | 5/2011 | Osato | 439/66 |
| 8,033,872 B2 * | 10/2011 | Yang et al. | 439/700 |
| 8,203,352 B2 * | 6/2012 | Fan et al. | 324/754.01 |
| 2003/0137316 A1 * | 7/2003 | Kazama | 324/761 |
| 2009/0009205 A1 * | 1/2009 | Kazama | 324/761 |

* cited by examiner

*Primary Examiner* — Joshua Benitez Rosario

(57) ABSTRACT

A low inductance contact probe comprises conductively coupled plungers. The plungers have coupling means which enable them to be slidably and non-rotatably engaged. A coil spring is attached to the plungers in a manner that prevents rotation of the spring's ends. The spring provides an axial plunger bias, and a torsional bias for conductive coupling between the plungers. The torsional bias is generated by an axial displacement of the spring and by twisting the spring a predetermined angle prior to attachment to the plungers. Torsion-induced contact forces between the plungers assure a direct conductive path through the plungers. The torsional bias further enables a positive attachment of the spring to the plungers. Plungers with hermaphroditic coupling means can be fabricated from a drawn profiled stock by stamping or machining. Essential plunger coupling features can be prefabricated in a drawn profiled stock with a high degree of dimensional accuracy and reproducibility.

36 Claims, 17 Drawing Sheets

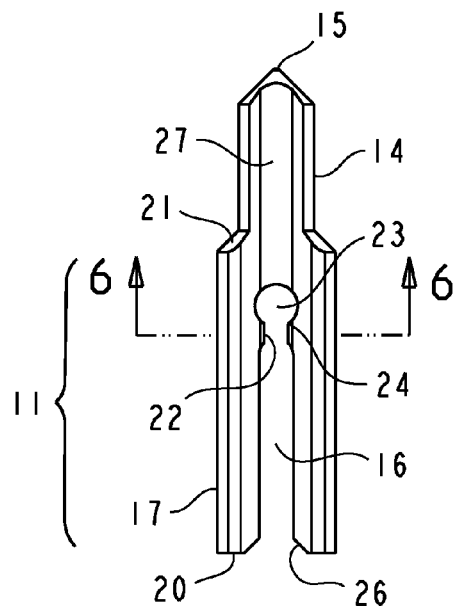
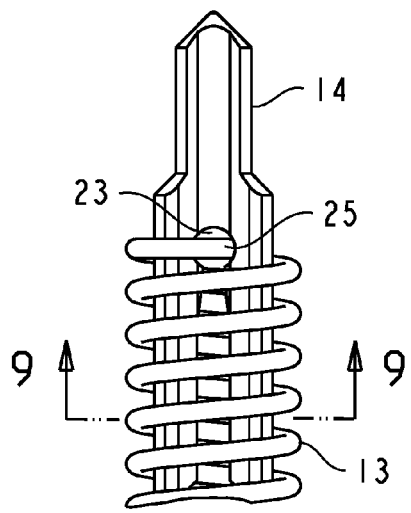
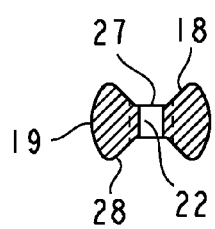
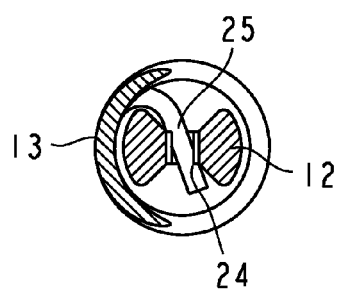
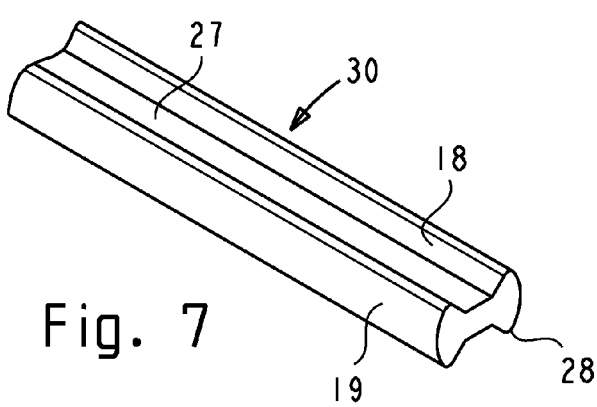
Fig. 5
Fig. 8
Fig. 6
Fig. 9
Fig. 7

LOW INDUCTANCE CONTACT PROBE WITH CONDUCTIVELY COUPLED PLUNGERS

BACKGROUND OF THE INVENTION

1. Technical Field

The present invention relates generally to electrical test probes and contacts for interconnecting integrated circuit (IC) devices and electronic components and systems, and specifically, to miniature high speed circuit probes and contacts having a low inductance and a low resistance. Applications include a test socket for connecting a ball grid array (BGA) IC package or a land grid array (LGA) IC package to a test system board; a socket for connecting an electronic device to a next level electronic hardware, battery and charging contacts, or other applications requiring low inductance and low contact resistance. The sockets can be used in an interposer configuration which provides separable interfaces for two oppositely disposed components having corresponding patterns (e.g., LGA to LGA or BGA to LGA) or, alternatively, the contacts can be permanently attached to a printed circuit board (PCB) or a system motherboard and provide a separable interface for an electronic device.

2. Background Art

Sockets and connectors are necessary for separably interconnecting IC devices such as bare chips, IC packages, and electronic modules, to other devices, motherboards, test systems, and alike. A typical application is an electrical socket for connecting an IC device to the next level of electronic hardware or to a test unit. The contacts are positioned and maintained in a required array by an insulating housing which has contact receiving cavities, disposed in a pattern corresponding to the array of input/output (I/O) terminals in each of the mated devices. The socket is usually interposed between the mated devices and provides a separable interface to each device. This allows the socket to be attached by clamping to one of the components, such as a PCB, typically by clamping with a standard hardware. The clamping preloads each contact against a respective I/O terminal on the PCB. The other end of the contact extends from the housing and is adapted to connect to the corresponding I/O terminal of the mating device.

A typical contact probe consists of a hollow barrel, a spring, and two plungers. The spring and the body portions of the plungers are guided in the barrel and are retained in the barrel which is rolled or crimped at both ends. In order to reduce the contact probe resistance and inductance, the probes typically rely on the plungers randomly tilting (i.e., deviating from axial alignment with the barrel) and electrically shorting to the barrel, so that most of the current could bypass the spring and flow through the barrel. This creates a conductive shunt which significantly lowers the overall contact resistance of the probe and the parasitic electrical effects of the coil spring. The plunger-to-barrel contact depends on the spring bias, fit tolerances of the plunger and the barrel, contact surface topography, and plating uniformity on the inside of the barrel. The diametrical clearance between the plungers and the barrel must be precisely controlled to prevent an excessive plunger tilt. Since the contact between the plunger and the bore of the barrel is localized along the line of contact where the edge of the plunger traverses the bore of the barrel, an excessive tilt often causes accelerated wear of contacting surfaces and a premature contact probe failure.

In the case of miniature sockets, contact compliance is an important consideration. The contact probe must have and adequate compliance (deflection capability) to account for planarity tolerances (z-directions variation of I/O terminal location due to tolerances, bowing of the board, etc.,), and to provide an adequate contact engagement even in worst case I/O terminal positioning. However, miniaturization of contact probes often leads to compliance problems since the small probes tend to have a low deflection capability, while the manufacturing tolerances, assembly tolerances, and board planarity, do not scale accordingly and remain substantially the same as for larger contacts.

Most test probes rely on a coil spring to provide the contact force and the resilient compliance necessary to assure that the contact force is in the desired range in the worst case tolerance conditions. Coil springs are relatively easy to manufacture in varying sizes, configurations, materials, and degree of compliance. In addition to providing a contact force, a compression spring may also serve as a conductive member. However, a coil spring acts as an electrical inductor at high frequencies and therefore presents electrical performance problems. Furthermore, it is often desirable to make the spring from a music wire or stainless steel which have poor electrical conductivity. This conflict between electrical and mechanical performance of the spring is best resolved by making the spring electrically insignificant. Various mechanisms have been employed to mitigate the adverse electrical effects of the spring, as illustrated by the patents cited below.

Another important characteristics of contact probes is the pointing accuracy, i.e., the ability to center the tip of the plunger on the target I/O terminal. The pointing accuracy becomes more important with dense trace patterns and smaller contact targets of highly integrated circuits. On the other hand, the pointing accuracy becomes more difficult to control in small contact probes as the plunger-to-barrel diametrical clearance is likely to have more impact on tilting of the plunger, especially when the plunger bodies which are guided in the barrel become very short. While the random tilting of the plungers enables the plunger-to-barrel contact, it adversely affects the probe's pointing accuracy.

Still another important consideration in many contact probes is the impact of friction on the contact force and the useful life of the probe. While the spring characteristics is usually linear, the friction can lead to non-linear or erratic forces. A sliding contact between components will generate friction which must be overcome by the spring bias, which can reduce the primary contact forces between the plungers and the respective I/O terminals. In the case of the tilted plungers in sliding contact with the bore, the bore surface is often irregular and the contact force between the edge of the plunger and the bore of the barrel is difficult to control. In severe cases, gauging of surfaces may expose bare metal, cause oxidation of surfaces and accumulation of a nonconductive debris between contact surfaces. This will cause high contact interface resistance and/or high friction forces which can cause a plunger to seize in the bore.

In view of the above, plating of contact probe components is an important factor in performance and useful life of contact probes. A barrier metal such as nickel and a noble metal such as gold are typically applied to the surfaces of the contact components to assure a low contact interface resistance and to protect contacts from corrosion. Plating of high aspect ratio and small diameter barrels creates challenges due to the difficulty of circulating the plating solution through a small bore. On the other hand, the bore of the barrel needs adequate plating to allow the plunger to make a reliable conductive connection to the surface of the bore. The need to assure an adequate plating thickness inside the barrel causes wasteful plating of non-contact outside surfaces of the barrel; up to 1.0 um of gold may be applied to the outside of the barrel in order to assure 0.5 um min plating inside the barrel, where conductive contact between the plunger and the barrel is made. Furthermore, the in-process quality control of the plating inside the barrel is difficult as the plating uniformity and thickness can only be evaluated by cutting the barrel lengthwise to expose the bore. In addition, the base surface of the bore is often irregular and difficult to clean thoroughly prior to plating. Plunger plating is also critical to the probe's electrical performance and often requires a hard, wear-resistant plating with good coverage of sharp points and edges.

The probe's cycle life is an important consideration in many test applications. If the probe length is short, the probe design, materials, and contact forces have significant impact on the cycle life of the probe and tradeoffs are necessary. The material of choice for miniature springs (e.g., having a mean coil diameter of less than 1.0 mm and a wire diameter of 0.05 to 0.15 mm) is music wire. Music wire has a very high tensile strength, and can provide a long mechanical life at high operating stress. However, music wire is made from a high carbon steel, is magnetic, and has low electrical conductivity. On the other hand, the preferred material for a spring that is used as a conductive member is beryllium copper, which has a higher conductivity but a lower elastic modulus and a lower strength than music wire.

While very reliable and durable probes can be produced in larger sizes, the desired probe characteristics is difficult to achieve in miniature probes, e.g., probes having an outside diameter of less than 1.0 mm and the length of less than 5 mm. In view of the machining tolerances and plating thickness variation on the inside of the barrel and on the plunger, the diametrical fit between the plunger and the barrel is difficult to tightly control. Since the plunger bodies which are guided in the bore of the barrel tend to be short, even a small diametrical clearance between the plunger and the bore can cause an excessive tilt of the plunger. The excessive plunger tilt can lead to a high localized wear and increased friction which may cause seizing of the plunger in the barrel, preventing return of the plunger to the original extension, and thus causing a premature contact failure. The surface defects and plating irregularities can significantly affect the sliding friction. The short probes also tend to have stiffer springs and less compliance. This can lead to large variation in contact forces and cause damage to the I/O terminals (e.g. deformation or shearing of BGA solder balls) when the contact forces are excessive.

Contact probes have been proposed to address some of the above issues as illustrated by the following patents:

U.S. Pat. No. 7,535,241 (2009) to Sinclair discloses a contact probe having a barrel, a coil spring, and a single plunger. The barrel has a stepped closed end which serves as a stop for the spring and allows the plunger body to conductively short to the barrel. This contact probe relies on a random tilting of the plunger for contact with the inside surface of the barrel. The bottom of the barrel must be reliably plated, which is difficult, especially when small diameter, large aspect ratio barrels are used. The deep drawn barrel can only provide an integral bull-nosed contact since pointed tips cannot be produced by the deep drawing process.

U.S. Pat. No. 5,990,697 (1999) to Kazama discloses a contact probe which utilizes a variable pitch coil spring as a primary conductive element. Such spring would be typically made from a higher conductivity alloy such as beryllium copper. The contact has some closely wound coils that become conductively shorted as the deflection progresses. Other coils must remain active so that a solid height is not reached. In order to satisfy the compliance requirement, these springs still require a substantial number of coils which are initially open, and only progressively are being closed (shorted) as the spring is being compressed. Such springs have a non-linear force vs deflection characteristics and can introduce a substantial variation in contact force and inductance due to manufacturing tolerances and non-planarity of mating interfaces. In worst tolerance cases, at a maximum deflection condition the contact force can be excessive, while at a minimum deflection condition an insufficient number of coils may be shorted so that the inductance can be excessively high.

U.S. Pat. No. 7,019,222 (2006) to Vinther discloses a one-piece coil spring contact wherein the coils are at an oblique angle to the direction of compression and are conductively shorted when the spring is compressed. While such contact can provide an excellent electrical performance, it is not scalable to smaller sizes without a significant loss of compliance (deflection capability). In this case, increasing compliance by increasing the number of coils will lead to a wider contact and will necessitate larger contact-to-contact spacing. Furthermore, the contact is not easily adaptable for use with a variety of plungers which are often needed to adapt the contacts to a particular I/O terminal configuration, such as a solder ball of a BGA device. In contrast, the conventional coil spring contacts are generally scalable to denser grids by extending the length when the spring diameter is reduced. (Although this quickly leads to excessively long contact probes with a high self-inductance.)

Other examples of low inductance contacts and probes can be found in U.S. Pat. Nos. 7,556,503 (2009) to Vinther; 7,134,920 (2006) to Ju et al; 6,696,850 (2004) to Sanders; 6,666,690 (2003) to Ishizuka et al; 6,043,666 (2000) to Kazama; 6,033,233 (2000) to Haseyama et al; and 5,641,314 (1997) to Swart et al.

The recent increases in circuit integration and operating frequencies pushed the available probes and contacts to their performance limits. While particular known contacts and probes have addressed some of the needs with various degree of success, none combine all the desired features in a single design. Consequently, there is a need for improved miniature contact probes and contacts having low contact inductance, low contact resistance, and which are suitable for use in test sockets and connectors with close contact spacing and high contact count.

SUMMARY

The present invention provides low inductance electrical contact probes and connectors for connecting electronic devices and systems having oppositely disposed complementary arrays of I/O terminals. A representative contact probe comprises: (1) a first plunger adapted to make a separable conductive connection to a terminal of the first device; (2) a second plunger adapted to make a separable conductive connection to a corresponding terminal of the second device; and (3) a coil spring providing an axial plunger bias for conductive connection of the plungers to the respective I/O terminals, and a torsional bias for conductive coupling between the plungers.

The plungers have coupling means which enable them to be slidably and non-rotatably coupled with each other. The spring is attached to the plungers in a manner that prevents rotation of the spring's ends. When an axial bias is applied to the spring by the displacement of the plungers, the spring tends to unwind. Since the ends of the spring are non-rotatably attached to the plungers, the spring is unable to unwind and thus generates a torsional bias against the plungers. In addition, the springs can be attached to the plungers with a predetermined angle of twist to create an initial torsional bias and to retentively attach the plungers to the spring. The resultant torsional bias rotationally biases the plungers against each other and thus provides contact forces for a conductive contact. The conductive coupling between the plungers provides a short an direct conductive path through the plungers while substantially bypassing the typically inductive and resistive spring. The parasitic electrical effects of the spring are thus substantially reduced. The spring can be further coated with an insulating coating to render the spring electrically insignificant.

Plungers with hermaphroditic coupling means can be advantageously fabricated from a drawn profiled wire by stamping or machining. The profiled wire provides coupling surfaces precisely defined by the drawing process. Thus the surface topography and the coupling fit tolerances can be precisely controlled. All the coupling surfaces are external and can be easily electroplated. The close coupling fit assures that the plungers remain substantially coaxial during operation which improves the contact probe's pointing accuracy.

DRAWINGS

FIG. 5 is a front view of a plunger, showing spring attachment features.

FIG. 6 is a bottom view of the plunger showing the plunger's cross-sectional profile.

FIG. 7 shows a profiled stock which can be used for fabrication of plungers with hermaphroditic coupling means.

FIG. 8 is a partial front view of a plunger retentively attached to a spring.

FIG. 9 is a cross-sectional view of the plunger retentively attached to a spring, taken as indicated by the lines 9-9 of FIG. 8.

DETAILED DESCRIPTION

Figure 1:
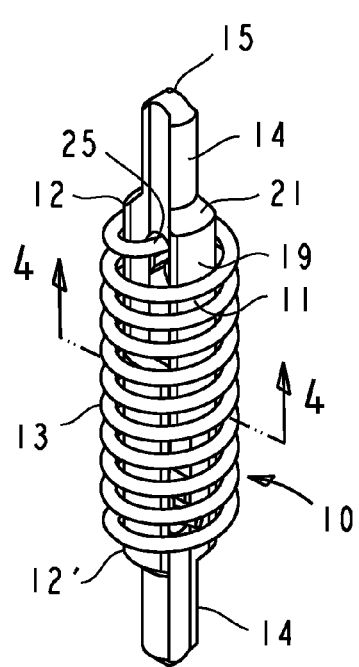
FIG. 1 is a perspective view of a contact probe having plungers with hermaphroditic coupling means.

The contact probes disclosed are of the type that are primarily used in an interposer type connector, wherein each contact is compressibly interposed between opposing terminals of a first device and a second device. "First device" and "first array" will generally refer to the device that is being plugged or connected whereas "second device" and "second array" will generally refer to the next level device or hardware to which the first device is being disengageably connected, usually represented by a PCB. The "first plunger" is disposed to contact the first device and is shown on the top side of the contact probe drawings, whereas the "second plunger" is disposed to contact the second device and is shown on the bottom side of the contact probe drawings. Otherwise, a contact probe can have identical, interchangeable plungers and the devices can have identical terminal pattern (e.g., LGA pads). In the cases where the plungers are identical or have substantially similar features, they are denoted by the same reference numerals, except the reference numerals of the second plunger, second end, etc, are primed when it is required for clarity. The contact probes disclosed are referred to as "probes", which implies a temporary connection (e.g., between a device and a test system) but they can also be advantageously used in sockets and connectors for any applications which require high performance interposer sockets and connectors were low inductance, low resistance, low wear, and/or close contact spacing is required. The contact probes can also be used as battery contacts, charging contacts, or as an alternative to more conventional contact technologies in end products such as consumer electronics, aerospace systems, medical devices, and alike.

FIGS. 1-4—Contact Probes Having Plungers with Hermaphroditic Coupling Means

FIG. 1 shows a contact probe 10 which can be used in an interposer connector. The contact probe comprises a first plunger 12, a second plunger 12', and a compression coil spring 13. All components have a central longitudinal axis and are coaxially disposed. Each plunger has an inner portion 11 comprising a coupling means which enables the plungers to be slidably and non-rotatably engaged with each other, and an outer portion 14 having a contact tip 15 adapted for making a separable conductive connection to a terminal of an electronic device. The inner portion of each plunger is attached to the respective end of the spring in a manner that prevents rotation of the spring's ends. When the contact probe is compressibly interposed between opposing terminals of mating devices, the plungers are forced inwardly and the spring provides the requisite contact force, or axial bias, to the plungers. When the spring is twisted, it further provides a torsional bias for conductive coupling between the plungers. The conductive coupling between the plungers establishes a short and direct current path through the plungers, while bypassing the spring. The contact probe therefore has a low inductance and a low resistance.

Figure 2:
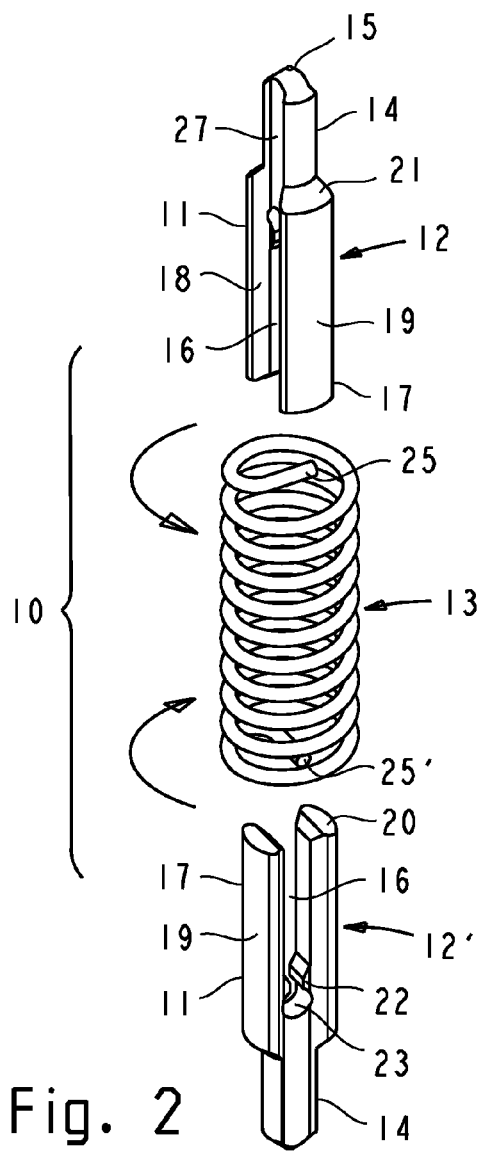
FIG. 2 is an exploded perspective view of the contact probe of FIG. 1.
Figure 4:
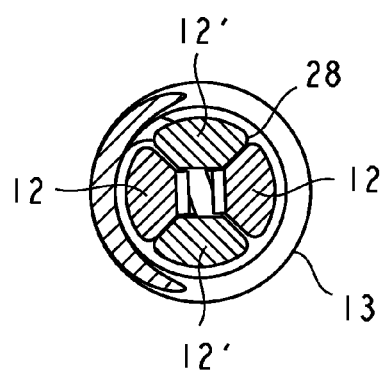
FIG. 4 is a cross-sectional view of the contact probe, taken at the mid-point of the probe's length, as indicated by the lines 4-4 of FIG. 1.

The components are shown more clearly on the exploded view of FIG. 2, which will also help to explain their assembly and cooperation. The body of each plunger has a slot 16 which bifurcates the inner portion of the plunger into two tines 17, each tine having canted surfaces 18, outside surface 19, and an inner end 20. The plunger body further has shoulders 21, which provide a means for retaining the contact probe in a cavity of an insulating housing. When the plungers are oriented at a right angle to each other as shown in FIG. 2, the coupling means of the plungers can be slidably and non-rotatably engaged with each other along the canted surfaces. When the coupling means are engaged, they form a substantially cylindrical outer surface that guides the spring. The slot has a narrowing 22 and an end hole 23, forming detents 24, which facilitate a retentive attachment of the spring to the plunger. The slot edge at the closed end of the slot bears against the spring when the spring is compressed.

Figure 3:
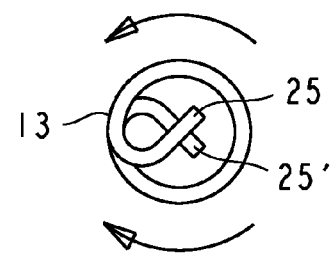
FIG. 3 is a top view of a compression spring wherein the spring is twisted so that the end filars are aligned for entry into the slots of respective plungers.

The coil spring has a first end and a second end cooperating with the first and the second plunger respectively. The spring has a radially and inwardly formed filar 25 at the first end and a substantially the same filar 25' at the second end. In order to engage both plungers with the spring, the filars must be at a right angle to each other as seen in FIG. 3, so that they align with the slots in the respective plungers. The spring can be fabricated with the filars being at a desired angle to each other, so that the spring can be twisted a predetermined angle to bring the filars to the right angle relationship. When the filars are substantially orthogonal, the plungers bodies are inserted into the spring until each filar is at the respective end hole 23 of the slot. When plungers are so inserted into the spring, the plunger tines are engaged as shown on the cross-sectional view of FIG. 4, taken at the mid-point of the contact probe's length. Since the plungers are non-rotatably engaged, the twist of the spring generates a torsional bias, which conductively couples the plungers and facilitates a retentive attachment of the spring to the plungers.

FIGS. 5-6 provide additional details of the plunger construction. Narrowing 22 and end hole 23 form detents 24 which enable trapping of filar 25 at the end hole. The inner ends of the tines have chamfers 26 to facilitate entry of the filar into the slot and to provide lead-in for the initial coupling of the plungers at assembly. The plunger further has a rib 27.

The slot, which bifurcates the inner portion of the plunger, is disposed substantially within the rib. Edge rounds 28 provide smooth transition between canted surfaces 18 and outside surfaces 19. FIG. 6 is a cross-sectional view of the plunger, taken through the slot narrowing, showing a bow tie shaped cross-sectional profile formed by the arcuate outside surfaces, the canted surfaces, the flat sides of the rib, and the edge rounds.

FIG. 7 shows a drawn profiled rod or wire stock 30 from which the plungers can be fabricated. A profiled stock is well suited for fabrication of plungers with hermaphroditic coupling means. Since the coupling means are identical, only one part (the stock) needs to be dimensionally controlled to achieve the desired coupling. The profiled stock can be obtained by drawing a continuous wire or a rod through successive dies until the final geometry is attained. This allows the essential features of the plunger such as the canted surfaces, the outside surfaces, the rib, and the rounds, to be prefabricated in the drawn stock with a high degree of dimensional accuracy and reproducibility. In particular, the profiled stock provides smooth coupling surfaces with a desired geometry and tight dimensional tolerances. In addition, very small features and small radii can be attained which would be impractical or impossible to achieve by machining. The profiled stock can be used to fabricate plungers by stamping or machining. Only the slot features and the plunger tip geometry must be added, which can be accomplished using either process. Alternatively, depending on the particular need, the plungers can be screw-machined from a round stock, as will be shown later.

FIGS. 8-9 illustrate the retentive attachment of the spring to a plunger using a torsional bias of the spring. A torsional bias is generated when the spring is twisted before the filars enter the respective plunger slots. The narrowing in the slot is slightly wider than the wire diameter of filar 25, while the end hole is significantly wider than the narrowing. When the filar traverses the plunger's slot, it passes through the narrowing and snaps into the end hole as the torsional bias forces the filars of the spring to rotate back. The resulting attachment is shown on the cross-sectional view of FIG. 9, where the filar is seen trapped behind detents 24. In addition, the twisting torque forces the filar against the side edges of the end hole which generates additional locking force. The plunger is thus positively attached to the spring and will resist separation.

FIGS. 10-14—Brief Discussion of Torsional Bias Mechanics

Figure 10:
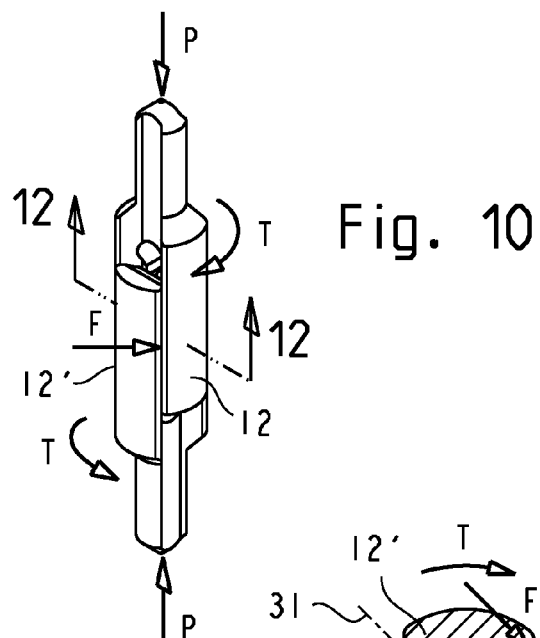
FIGS. 10-12 illustrate the torsional bias mechanics.
Figure 12:
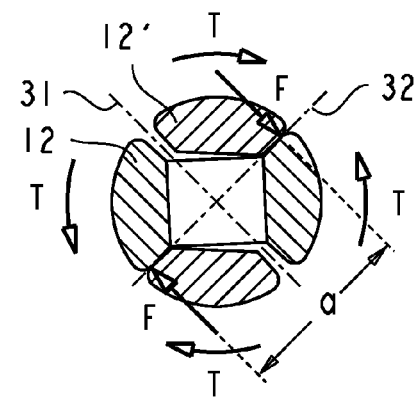

FIG. 10 shows plungers 12 and 12' in a mated state. The spring is omitted to fully reveal the plungers, which are slidably and non-rotatably engaged. The actions of the spring are represented by the forces and moments which the spring generates. A compressive displacement of the spring generates axial contact forces, indicated by the arrows marked "P". The spring further provides a torsional bias to the plungers, which is indicated by the torque arrows marked "T". Since the plungers cannot rotate relative to each other, the torsional bias generates contact forces at the coupling surfaces of the plungers, indicated by the arrows marked "F" in FIG. 12. The contact force F=T/a, where "a" is the distance between the coupling forces F, as shown in FIG. 12. For a given spring, the total torsional bias required to generate a desired coupling force F is approximately:

$$\beta = \frac{3667\ N\ F\ a\ D}{E\ d^4\ \cos\varphi}(1 + v\ \sin^2\varphi)$$

where:

β—torsional bias in degrees
N—number of active coils
P—plunger contact force
D—mean diameter of the coils
d—wire diameter
φ—pitch angle (slope of the coils)
E—modulus of elasticity
F—contact force at coupling surfaces
a—distance between coupling forces F
v—Poisson's ratio One contribution to the torsional bias is due to the compression of the coil spring. When a coil spring is compressed, the coils attempt to distribute the energy by unwinding. If the ends of the spring are unconstrained, the unwinding will cause the ends of the coil spring to rotate. However, if the ends of the compression spring are prevented from rotation, the spring will be twisted between the constrained ends and thus will be under a torsional bias. The magnitude of the compression-generated bias can be calculated by considering the compression spring to be a torsion spring with the ends rotated by an angle equivalent to the compression-generated twist. The forces generated will be the same as those required to prevent rotation of the ends due to compression-generated torsional bias. For a given spring compressed by an axial load P, the compression-generated bias β' will be approximately:

$$\beta' = \frac{1833\ N\ P\ D^2}{E\ d^4} * v\ \sin\varphi$$

The above formulas are approximate since they assume that the initial spring parameters such as pitch angle φ, mean coil diameter D, and the number of active coils N, do not change as the compressive and torsional loads are applied. The formulas do not include any stress correction factors which are customary in spring design practice. It is further assumed that the spring remains elastic under combined axial and torsional loading in all load conditions.

The compression springs used in contact probes tend to have a low initial pitch angle φ, and will provide a relatively low compression-generated torsional bias. In some cases, the compression-generated bias may be sufficient for conductive coupling between the plungers, especially in combination with other effects such as spring buckling and a random contact probe tilt in the insulator housing cavity. In most cases, however, an additional torsional bias will be useful to assure a robust coupling contact force between the plungers. The additional torsional bias can be generated by twisting the coil spring a predetermined angle β'' before it is attached to the plungers, as in contact 10.

While the compression-generated torsional bias is proportional to the spring's compressive displacement and is in the spring unwinding direction, the initial assembly bias is constant (independent of the spring compression) and can be either in the spring winding or spring unwinding direction. The compression-generated bias is also self-cancelling as the spring recoils on unloading of the contact probe. The recoil of the spring helps the plungers to recover to their original extension. On the other hand, the initial assembly bias is permanent and provides a constant preload between the coupling surfaces. The preload assures clearance-free sliding fit between the plungers and thus helps to maintain the coaxiality of the plungers. The assembly torsional bias can also be used advantageously to positively attach the spring to the plungers, as discussed above.

The initial assembly bias $\beta''$ is cumulative with the compression-generated bias $\beta'$. If the initial torsional bias is in the same direction as the compression-generated bias, the assembly twist of the spring needed to meet the total required bias $\beta$ will be reduced by the magnitude of the compression-generated bias, or $\beta''=\beta-\beta'$ However, if the assembly bias is in the opposite or winding direction, the required assembly twist of the spring will be increased by the magnitude of the compression-generated bias, or $\beta''=\beta+\beta'$.

Figure 26:
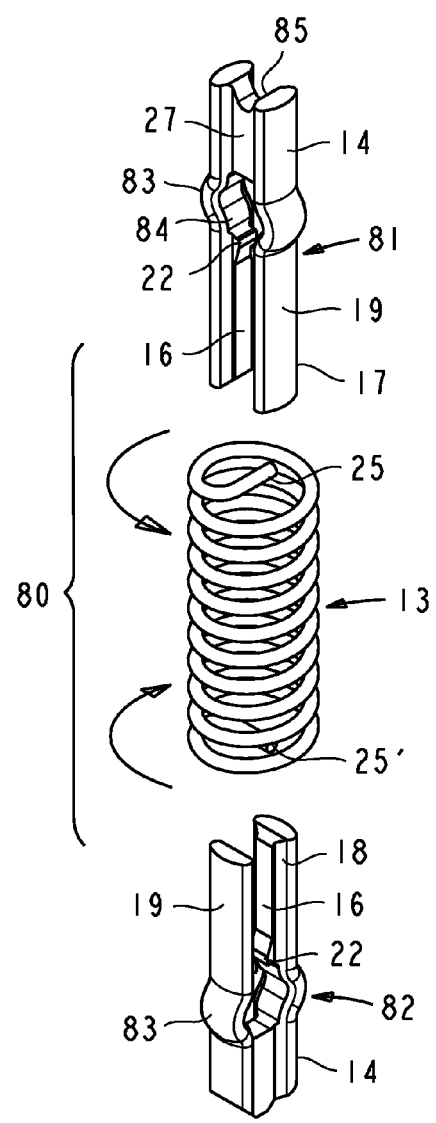
FIG. 26 is an exploded perspective view of the contact probe of FIG. 25.
Figure 29:
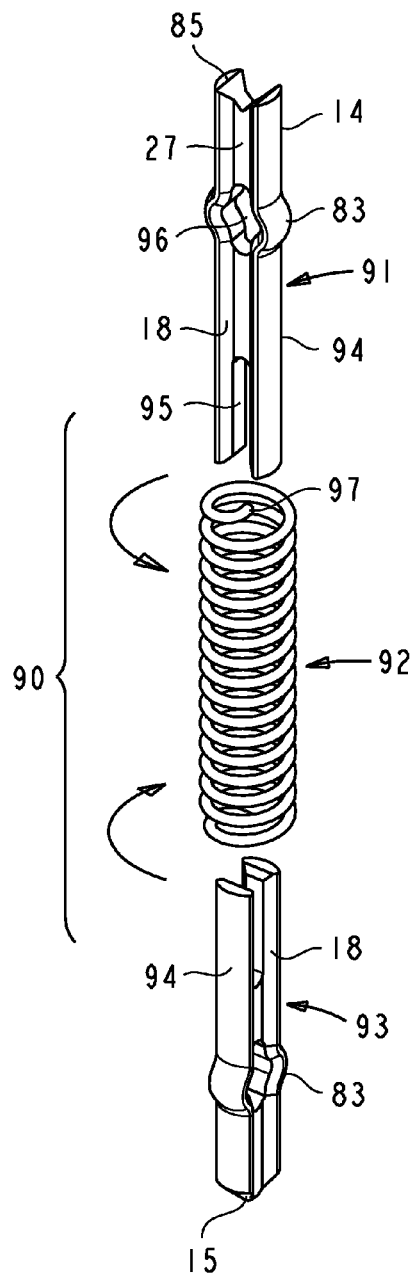
FIG. 29 is an exploded perspective view of the contact probe of FIG. 28.

The compression springs are usually right-hand wound as reflected in the drawings. The assembly twist of compression springs shown in FIGS. 2, 26, and 29 is in the spring unwinding direction. This urges the springs to unwind and thus provides a torsional bias in the same direction as the compression-generated bias, which is also due to the spring's urge to unwind. However, the assembly twist can also be in the spring unwinding direction as shown in FIGS. 39, 42, 54, and 57. The magnitude and the direction of the actual assembly twist can be determined based on a particular spring type, size, material, desired spring parameters, coupling configuration, contact forces, stress considerations, and other requirements. Furthermore, the above principles are also applicable to left-hand wound springs as well as to the extension springs used in probe embodiments discussed in a separate section below. In either case, the direction of the spring winding and the direction of the torsional bias must be properly accounted for. Since the above formulas are approximate and the torsional bias may be further affected by other factors, such as spring slenderness ratio (spring length divided by mean diameter of the coils), residual fabrication stresses, configuration of spring ends, and spring attachment to plungers, the actual torsional bias is best developed with experimental input.

Figure 11:
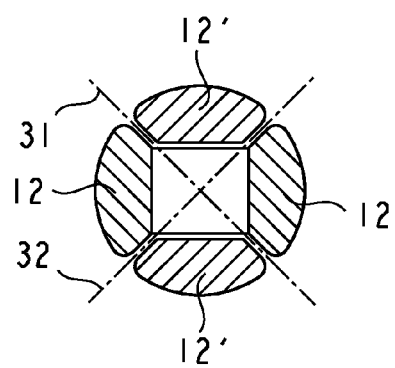

Referring back to the drawings, FIGS. 11-14 are cross-sectional views of the plungers taken at the mid-point of the probe. The initial spacing between the coupling surfaces is exaggerated to show the coupling configurations clearly. In FIG. 11, the plungers are in an unbiased or reference state. The coupling surfaces of the plungers are spaced equally from each other and are equidistant from diagonals 31 and 32.

FIG. 12 shows the plungers in a conductive coupling. As the torsional bias is applied, the plungers rotate about their longitudinal axes in opposite directions within the small clearance between the coupling surfaces. The torque arrows indicate the direction of plunger rotation. The coupling surfaces adjacent to diagonal 31 are brought into contact while the surfaces adjacent to diagonal 32 pull away from each other. The coupling contact is made near the tangency lines between canted surfaces 18 and edge rounds 28, where the contact forces F are created in reaction to the torque.

In general, the magnitude of the contact force at the coupling surfaces will be a fraction of the axial force P biasing the plungers, e.g., ¼ of P, or less. This is necessary in order to assure that the sliding friction due to the torsional coupling is easily overcome by the axial bias of the spring, so that the plungers deliver the required contact force to the respective I/O terminals and can return to the original extension after the axial force is removed. For an exemplary compression spring made from a music wire, where P=0.3 Newtons, a=0.6 mm, d=0.1 mm; D=0.8 mm, N=8; $\nu$=0.31, and $\phi$=7 degrees; each coupling force F could be about 0.075 Newtons. Since there is a contact force F at each of the two coupled areas, the total contact force will be 0.15 Newtons. Assuming a coefficient of friction $\mu$=0.5, the maximum friction force impeding the return of the plunger would be 2 F $\mu$=0.075 Newtons. The total twist of the spring required to generate the necessary torsional bias would be approximately 52 degrees. The assembly twist would be approximately 47 degrees in the spring winding direction or, alternatively, 57 degrees in the spring unwinding direction. The exemplary spring should be viewed as illustrative but not limiting. Lower coupling forces may be adequate since the hardness, topography, and plating of the external coupling surfaces can be precisely controlled, and a generous contact wipe is provided by the sliding action of the plungers. For larger contact probes the coupling forces can be significantly higher.

Figure 13:
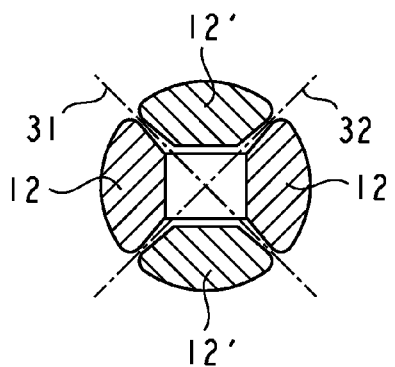
FIGS. 13-14 are cross-sectional views of additional coupling configurations.

In FIGS. 11 and 12 the canted coupling surfaces in each tine form an included angle of 90 degrees. Therefore, the adjacent coupling surfaces of the plungers are initially parallel to each other and to the diagonals. A relative rotation of the plungers will force the coupling surfaces to make conductive contact near the tangency of outside surfaces 19 and edge rounds 28. FIG. 13 shows an alternate configuration of the canted surfaces wherein the included angle between the canted surfaces is greater than 90 degrees. This enables a more predictable contact near the outside edge rounds and away for the edges of the slot. When the plungers are made from a drawn profiled wire, the outside edge rounds are defined by the drawing process, which can provide smooth and dimensionally precise coupling surfaces.

Figure 14:
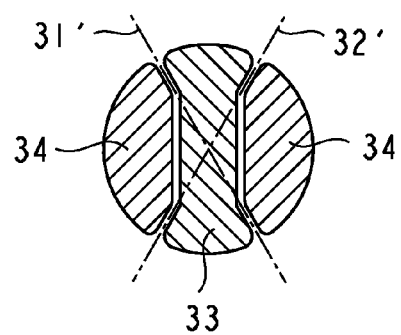

While hermaphroditic coupling means are well suited for the torsional coupling means, there are many other possible coupling configurations that can be employed to slidably and non-rotatably couple the plungers. FIG. 14 is an example of a male-female type coupling means. A plunger 33 has a blade-like body which is received in a bifurcated body of a plunger 34. The diagonals 31' and 32' form an oblique angle.

FIGS. 15-18—Additional Embodiments of Contact Probes Having Hermaphroditic Coupling Means FIGS. 15-18 show additional embodiments of contact probes with hermaphroditic coupling means. The plungers in these embodiments can be made from a drawn profiled stock by machining, or with small modifications, by stamping.

Figure 15:
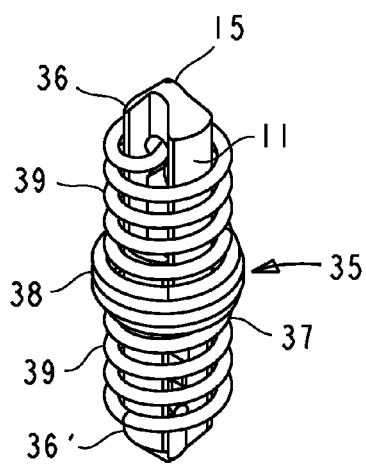
FIG. 15 shows a low profile contact probe having a spring with closely wound center coils which have an enlarged diameter to form a retention collar.

FIG. 15 shows a low profile contact probe 35 comprising a first plunger 36, a second plunger 36', and a compression spring 37. The spring has a middle portion 38 and end portions 39. The end portions of the spring are guided by the inner portions of the plungers. The middle coils have a larger diameter than the end coils to form a retention collar, which facilitates retaining the contact probe in an insulator housing cavity. The middle coils may be closely wound. Since the spring collar provides a retention means, the plungers do not need shoulders (such as shoulders 21 in contact 10). This makes the outer portion of each plunger very short and thus enables a very short contact probe.

Figure 16:
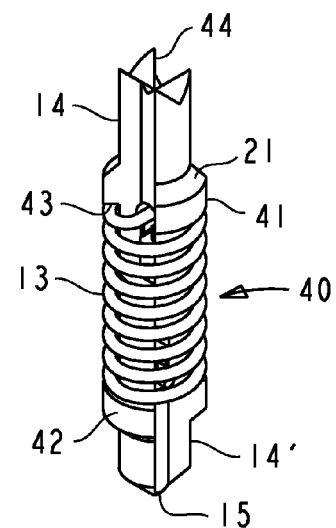
FIG. 16 shows a contact probe with the first plunger adapted for connecting to a solder ball of a BGA device.

FIG. 16 shows a contact probe 40 comprising a first plunger 41, a second plunger 42, and a compression spring 13. Each plunger has shoulders 21 which extend radially from the plunger inner portion to provide spring supporting surfaces 43. The outer portion of the first plunger has a crown tip 44, suitable for making contact with a solder ball terminal of a BGA device. The outer portion of the second plunger has a point tip 15 suitable for contact with a terminal of an LGA device.

Figure 17:
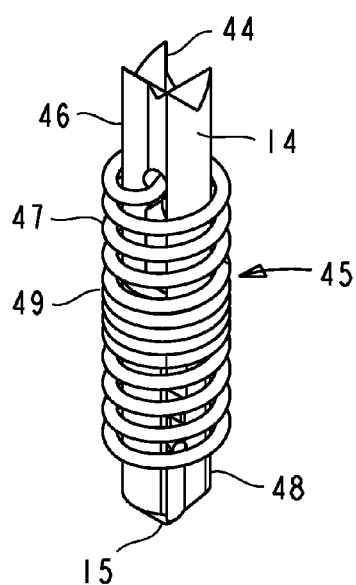
FIG. 17 shows a contact probe having a spring with closely wound center coils and the first plunger adapted for connecting to a solder ball of a BGA device.

FIG. 17 shows a contact probe 45 comprising a first plunger 46, a compression spring 47, and second plunger 48. The outer portion of the first plunger has a crown tip 44 suitable for contact with a solder ball terminal of a BGA device. The spring has closely wound center coils 49. When the center coils are touching, they are not contributing to the axial stiffness of the spring. However, the closely wound coils are active in the torsional mode. Therefore, adding closely wound coils allows to lower the torsional stiffness of the spring without significantly affecting the axial stiffness of the spring, or spring rate.

Figure 18:
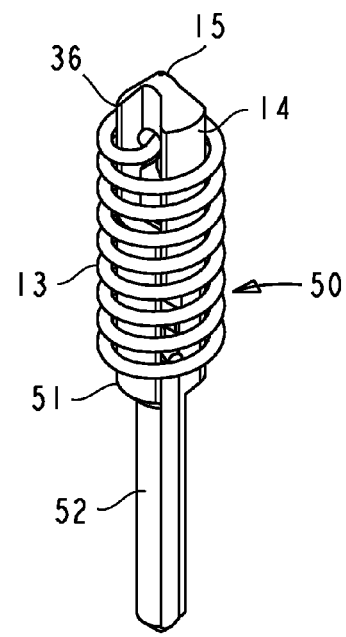
FIG. 18 shows a low profile contact probe adapted for a permanent solder connection to a plated-through hole of a PCB.

FIG. 18 shows a contact assembly 50 comprising a first plunger 36, a second plunger 51, and a compression spring 13. The second plunger has an extended outer portion 52 suitable for soldering in a plated-through hole of a PCB or for plugging into a socket.

FIGS. 19-24—Insulator Housing Cavity Details for Retaining Contact Probes in Sockets and Connectors The disclosed contact probes can be utilized in sockets and connectors for connecting electronic devices having complementarily disposed I/O terminal arrays. The devices may include chip packages, bare chips, pc boards, batteries, flexible circuits, leaded devices, BGA devices, LGA devices, and alike. The sockets and connectors are typically used in an interposer configuration which provides separable interfaces for two oppositely disposed components having corresponding terminal arrays (e.g., LGA to LGA or BGA to LGA). Alternatively, one end of each contact probe can be permanently soldered in a plated-through hole of a PCB or a system motherboard while the other end provides a separable connection to a terminal of an electronic device. Still another option is to plug the contact probes into socket contacts which are permanently attached to terminals of another device or a PCB. In most cases, an insulating housing is required to sustain the contact probes in a desired array. FIGS. 19-22 show insulator cavity details for receiving and sustaining various contact probe embodiments in sockets and connectors. The contact probes are typically retentively pre-assembled in the cavities of an insulator housing. The housing usually has a provision for attaching or clamping to a PCB or other device. The cavity features shown in the cross-sectional drawings can be viewed as round, consistent with drilling and reaming, but other shapes can be obtained by milling or molding.

Figure 19:
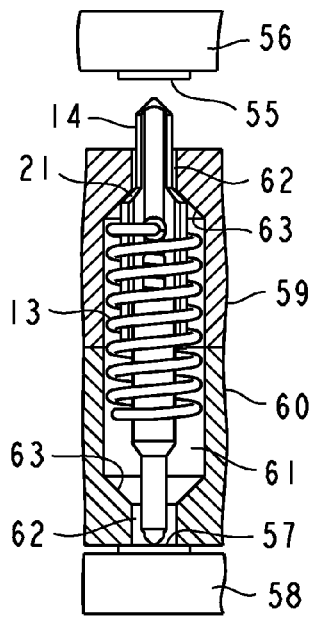
FIG. 19 is a cross-sectional detail of an interposer connector, showing the probe of FIG. 1 assembled in a cavity of an insulative housing and preloaded against an LGA terminal of the second device.
Figure 20:
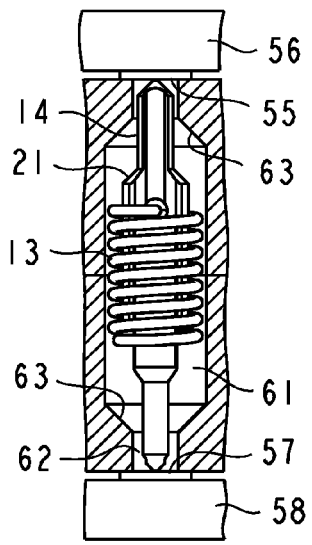
FIG. 20 is a cross-sectional detail of an interposer connector, showing the probe of FIG. 1 assembled in a cavity of an insulative housing and fully compressed between the terminal of the first device and a corresponding terminal of the second device.
Figure 23:
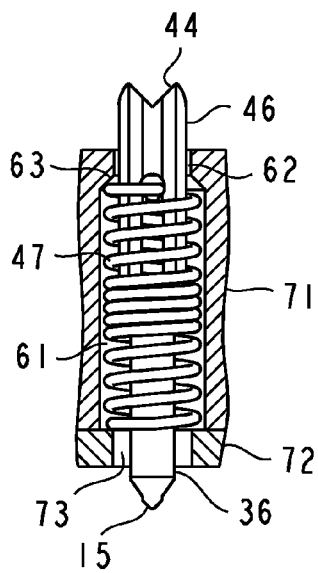
FIG. 23 is a cross-sectional detail of an interposer connector, showing an insulator cavity detail for the contact probe of FIG. 17.

FIGS. 19-20 are cross-sectional details of an interposer connector for connecting an LGA I/O terminals 55 of a first device 56, to opposing terminals 57 of a second device 58. The contact probes are contained in a two-piece housing comprising a first piece 59 and a second piece 60. The two pieces of housing form an inner opening 61 which accommodates the inner portions of the plungers and the spring. Each piece of housing further has an outer opening 62 which guides the outer portion 14 of the plunger. The outer openings have a smaller diameter than the inner opening, forming retaining surfaces 63. The retaining surfaces cooperate with the shoulders of respective plungers to prevent the plungers from escaping the cavity and to provide a bearing surface when the plungers are preloaded against those surfaces. The two pieces of housing do not need to be identical. For example, the bottom piece can be thinner or in the form of a retaining plate as shown in FIG. 23.

FIG. 19 shows probe 10 assembled in a cavity of an insulative housing and preloaded against a terminal of the second device. The second plunger is axially displaced and exerts a contact force against the second terminal. Shoulders 21 of the first plunger are preloaded against the retaining surface in the first piece of the insulator housing. The outer portion of the first plunger extends a predetermined distance from the insulator housing. When the first device is forced against the connector as shown in FIG. 20, the contact probe is fully compressed between the terminal of the first device and a corresponding terminal of the second device.

Figure 21:
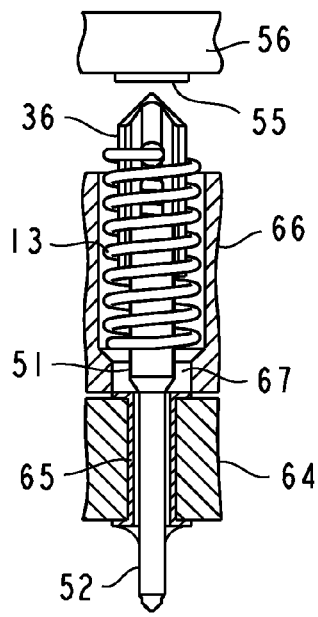
FIG. 21 is a cross-sectional detail of a connector, showing an insulator cavity detail for the contact probe of FIG. 18, having the second plunger attached to a plated-through hole of a PCB.

FIG. 21 is a cross-sectional detail of a connector for connecting a first device 56 to a PCB 64 of a second device. The connector utilizes low profile contact probes 50 which are soldered in plated-through holes 65 of the PCB. Since the probes are sustained by the PCB, a one piece insulator housing 66, having a simple stepped-hole cavity 67 can be used. Alternatively, the outer portion of the second plunger can be plugged into a socket contact permanently installed in a second device or a PCB, which allows contact probe replacement (this may be desirable in systems that are intended for a high number of operating cycles).

Figure 22:
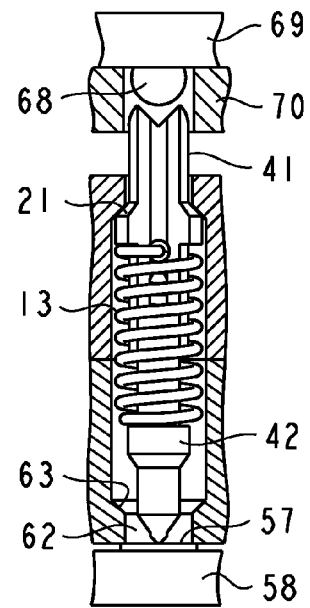
FIG. 22 is a cross-sectional detail of an interposer connector, showing an insulator cavity detail for the contact probe of FIG. 16.

FIG. 22 is a cross-sectional detail of an interposer connector for connecting BGA I/O terminals 68 of a first device 69, to opposing LGA terminals 57 of a second device 58. Contact probes 40 are contained in a two-piece housing similar to that in FIG. 19. A floating base 70 can be used to align and guide the BGA device as it engages the contact probes.

FIG. 23 is a cross-sectional detail of an interposer connector utilizing contact probe 45 or alike. The insulator housing comprises a first piece 71 and a second piece, or retaining plate, 72. The first piece has an inner opening 61 which accommodates the inner portions of the contact and the spring. The first piece of housing further has an outer opening 62 which guides plunger 46. The outer opening has a smaller diameter than the inner opening, forming retaining surface 63. The retaining plate has a hole 73 which is smaller than the inner opening and guides the outer portion of the second plunger. The retaining surface and the retaining plate cooperate with the respective end coils of spring 47 to retain the contact probe in the insulator housing cavity.

Figure 24:
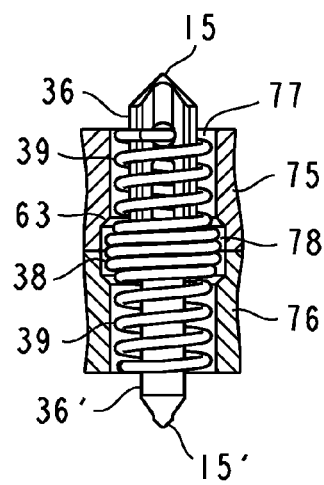
FIG. 24 is a cross-sectional detail of an interposer connector showing an insulator cavity detail for the contact probe of FIG. 15.

FIG. 24 is a cavity detail of an interposer connector utilizing contact 35 or alike. The insulator housing comprises a first piece 75 and a second piece 76. Each piece has an outer opening 77 which guides the respective end portion of the spring. The two pieces further combine to form a larger diameter inner opening 78 which accommodates the middle portion of the spring having diametrically enlarged coils. Retaining surfaces 63 cooperate with the diametrically enlarged middle coils to retain the contact probe in the insulator housing.

FIGS. 25-37—Contact Probes with Plungers Having Hermaphroditic Coupling Means and Stamped Features.

One of the objects of the present invention is to provide cost effective contact probes by using a drawn profiled stock for fabrication of plungers. Additional cost advantages can be realized when the plungers are fabricated from a drawn wire by stamping, which is one of the most cost-efficient fabrication processes and produces precisely dimensioned parts at high production rates and with good reproducibility.

Figure 25:
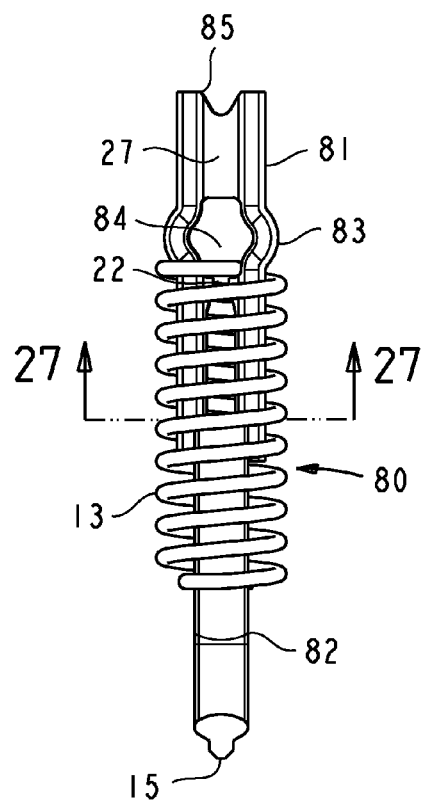
FIG. 25 is a side view of a contact probe having plungers with stamped features.

FIG. 25 is a side view of a contact probe 80 comprising a first plunger 81, a compression coil spring 13, and a second plunger 82. The components are shown separately in the exploded view of FIG. 26. Each plunger has shoulders 83 which are formed by forcing the bifurcated portions of the plunger outwardly, away from the central axis of the plunger. Slot 17 and narrowing 22 are substantially as in contact 10. However end hole 84 is extended to provide the bifurcation needed to form the shoulders. The first plunger further comprises a crown tip 85 adapted for connecting to a solder ball terminal of a BGA device. The second plunger has a pointed tip, suitable for connection to an LGA terminal. All slot features can be stamped by punching portions of rib 27 of the profiled stock. The end hole can be punched first to allow forming of the shoulders. After the shoulders are formed, the remaining features of the slot can be punched. The plunger tips can be produced using various stamping press techniques such as coining, swedging, and blanking.

Figure 27:
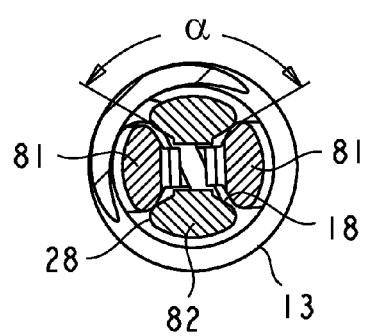
FIG. 27 is a cross-sectional view of the plunger of FIG. 25, taken as indicated by the lines 27-27 of FIG. 25.

FIG. 27 is a cross-sectional view of contact probe 80, taken across the coupled plungers. The included angle marked "a" between canted surfaces 28 is larger than 90 degrees to provide a wider rib 27 in order to facilitate punching of the slot features. The larger included angle also helps to assure the coupling contact at outside radii 28, away from the punched edges.

Figure 28:
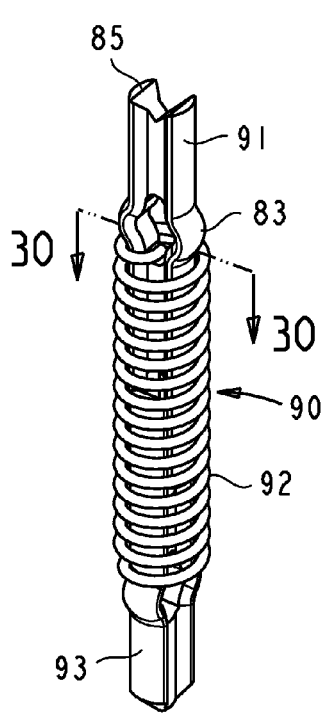
FIG. 28 is a perspective view of a long embodiment of the contact probe having plungers with stamped features.

FIG. 28 is a perspective view of a contact probe 90, which is a longer version of contact probe 80. If the length of the contact probe is not constrained by a low inductance requirement, a longer contact can provide a higher compliance and longer cycle life. The long probe shares many features with the short probe, and the corresponding features are designated by the same reference numerals. The key difference is that the longer plunger body is bifurcated only to the extend needed for engagement, that is, to provide an initial engagement and the operational displacement of the plungers. This assures that the integrity of the plunger body is not compromised by an excessively long slot. Furthermore, the trap hole is not contiguous with the slot so the end filar is replaced with a shorter hook.

Figure 30:
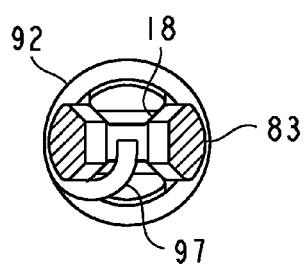
FIG. 30 is a cross-sectional view of the contact probe of FIG. 28, taken as indicated by the lines 30-30 of FIG. 28.

Contact probe 90 comprises a first plunger 91, a compression coil spring 92, and a second plunger 93. The components are shown separately in the exploded view of FIG. 29. Each plunger has an elongated inner portion 94, stamped shoulders 83, and an outer portion 14. The inner portion of each plunger has a slot 95. Alternatively, only one plunger can have a slot, the other plunger having a solid inner portion throughout. A slotted hole 96 enables forming of the shoulders 83. The slotted hole can also serve as a trap hole for attachment of the spring. The spring has a hook 97 at the first end and an identical hook 97' at the second end. The hooks cooperates with the canted surfaces of the respective plungers to non-rotatably engage the plungers. If the hook is formed beyond the surface of the rib, it will also snap into the trap hole 96 thus positively attaching the plunger to the spring, as shown in FIG. 30.

Figure 31:
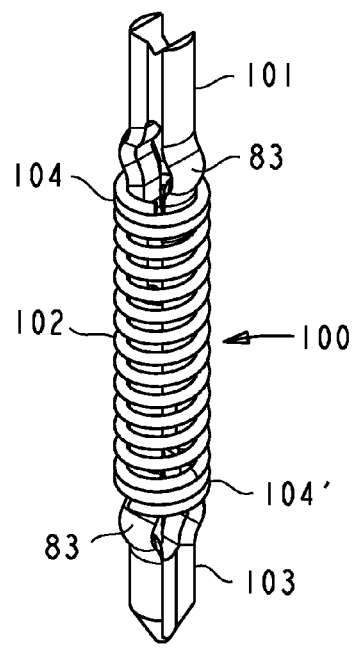
FIG. 31 is a variation of the contact probe of FIG. 28, wherein the plungers are attached to the spring by an interference fit between closely wound end coils of the spring and a diametrically enlarged portion of the plunger body.

FIG. 31 shows a contact probe embodiment wherein the spring is attached to each plunger by an interference fit between the spring's end coils and a diametrically enlarged portion of the plunger body. Contact probe 100 comprises a first plunger 101, a compression coil spring 102, and a second plunger 103. The spring has closely wound coils 104 at the first end, and 104' at the second end. The diametrically enlarged portion 105 of the plunger (better seen in FIG. 32) is sized to make an interference fit with the end coils 104. Alternatively, or in addition, the end coils may be fused to the body of the plunger, e.g., by laser welding.

Figure 32:
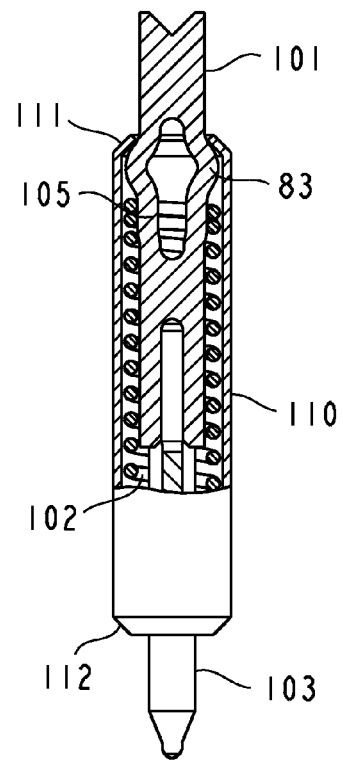
FIG. 32 shows the contact probe of FIG. 31, further comprising a barrel.

The disclosed contact probes are fully functional and provide low resistance current path without a barrel. The plungers are attached to the spring and the assembly can be handled as a unit for assembly in connector interfaces. However, in some instances it may be desirable to add a barrel, e.g., when a probe contact is used in a header or when a longer contact probe and/or a substantial internal plunger preload is desired. FIG. 32 shows a contact 100 further comprising a thin barrel 110. The barrel has a first end 111 and a second end 112, which are rolled inwardly, to retain the plungers. When a barrel is used, a positive attachment of the plungers to the spring is not required. Accordingly, when contact probes are used with a barrel, attachment features such as a slot narrowing, an end hole, or a trap hole are redundant. As long as the plungers are non-rotatably coupled and the spring ends are prevented from rotation, the benefit of the torsional bias will be realized.

Figure 33:
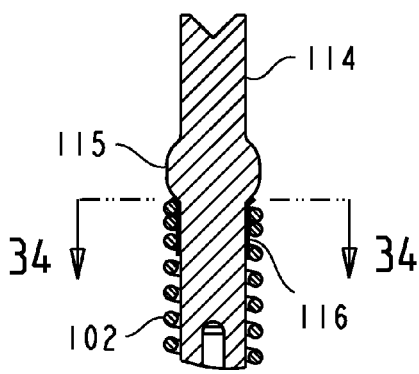
FIG. 33 shows an alternate attachment of a spring to a plunger by bonding.

FIG. 33 is a partial cross-sectional view of a contact probe wherein a plunger 114 has swedged solid shoulders 115 and the end of the spring is attached to the plunger by a bond 116. The bond can be an adhesive, a solder, a weld, and alike. The bonded portion of the plunger can be sized to make a slight interference fit with the end coils of the spring. Adhesive preforms and solder preforms can be used to facilitate adhesive bonding or solder reflow operation. The adhesive can be further used to electrically isolate the spring from the plungers. The spring may also have an insulating coating.

Figure 34:
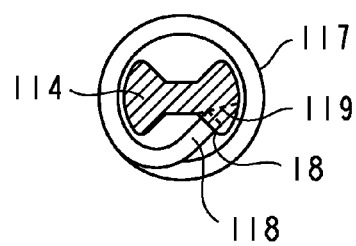
FIG. 34 is a cross-sectional view of a plunger non-rotatably attached to a spring, taken as indicated by lines 34-34 of FIG. 33.

FIG. 34 shows still another method of non-rotatably engaging plungers to a spring. A spring 117 has a hook 118 which engages a cooperating canted surface 18 of contact 114 to support the torsional bias of the spring. The plunger may further have an undercut 119 (show in hidden line) which enables a positive attachment of the spring to the plunger. This engagement configuration can be used when the plunger's inner portion is long and only partially slotted, e.g., plungers 91, 93, and 114.

Figure 35:
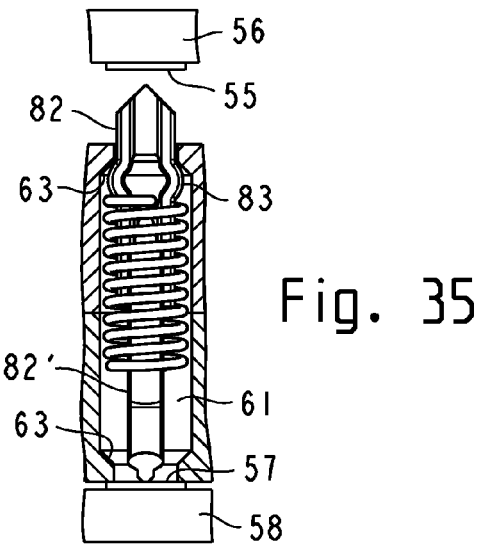
FIG. 35 is a cross-sectional detail of an interposer connector, showing a contact probe with hermaphroditic plungers and pointed tips, assembled in a cavity of an insulative housing and preloaded against an LGA terminal of the second device.
Figure 36:
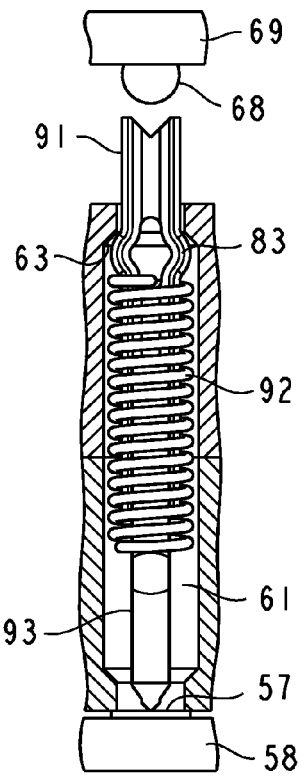
FIG. 36 is a cross-sectional detail of an interposer connector, showing the probe of FIG. 28 assembled in a cavity of an insulative housing and preloaded against an LGA terminal of the second device.
Figure 37:
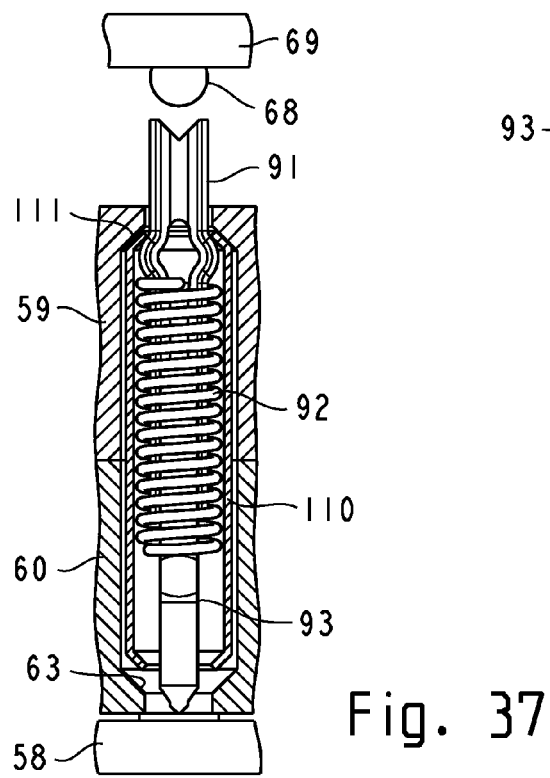
FIG. 37 is a cross-sectional detail of an interposer connector, showing the probe of FIG. 28 further comprising a barrel and assembled in a cavity of an insulative housing, and preloaded against an LGA terminal of the second device.

FIGS. 35-37 are partial cross-sectional views of interposer connectors, showing insulator cavity details for contact probes with stamped features. The cavity details are essentially the same as those described earlier. In FIGS. 35-36, plunger shoulders 83 cooperate with the respective retaining surfaces 63 in the insulator cavity to retain and preload the contact probe. In FIG. 37, the rolled ends 111 and 112 of the barrel cooperate with the respective retaining surfaces 63 to retain the contact probe in the insulator housing.

FIGS. 38-43—Contact Probe with Plungers Having Machined Features.

The profiled stock offers substantial advantage for cost effective high volume manufacturing of plungers. However, a round stock provides a good alternative for smaller runs or special plunger configurations. A round stock also allows standard tip configurations and a conventional retention collar to be implemented in torsionally biased contact probes.

Figure 38:
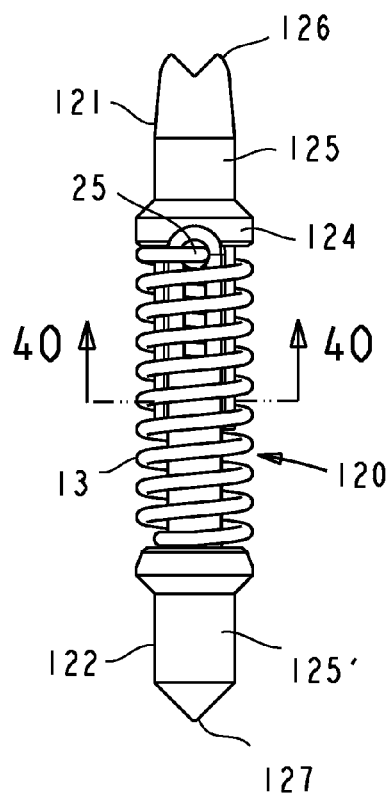
FIG. 38 is a perspective view of a contact probe having hermaphroditic plungers with round outer portions.
Figure 40:
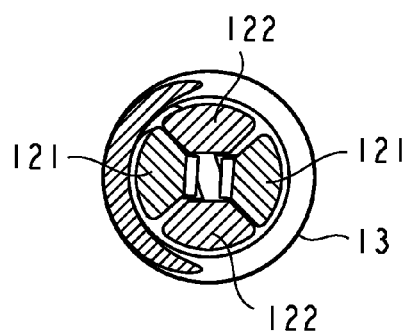
FIG. 40 is a cross-sectional view of the contact probe of FIG. 38, taken as indicated by the lines 40-40 of FIG. 38.
Figure 39:
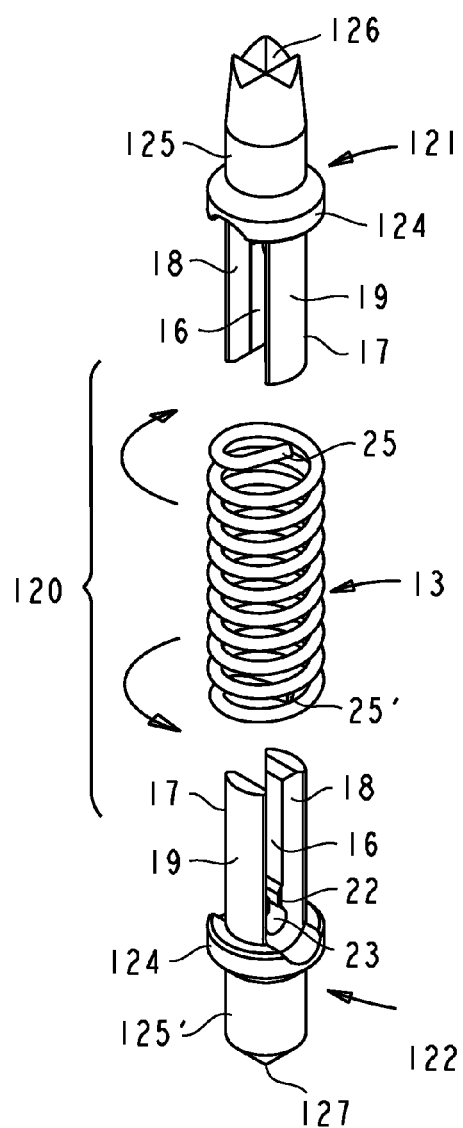
FIG. 39 is an exploded perspective view of the contact probe of FIG. 38.

FIG. 38 shows a contact probe 120 comprising a first plunger 121, a compression coil spring 13, and a second plunger 122. The components are shown separately in the exploded view of FIG. 39. Each plunger has a collar 124 adapted to support compression of the spring and to retain the contact probe in the insulator housing cavity. The first plunger comprises an outer portion 125 having a 4-point crown tip 126. The second plunger comprises a pointed tip 127. The coupling means and the spring attachment features can be substantially the same as those described in connection with contact 10 above, and are indicated be the same reference numerals. FIG. 40 is a cross-sectional view of contact probe 120, taken across the coupled plungers.

Figure 41:
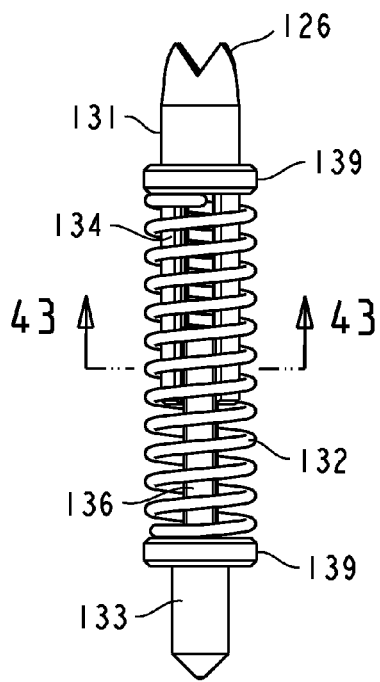
FIG. 41 is a perspective view of a contact probe having a blade-and-slot coupling between plungers.
Figure 43:
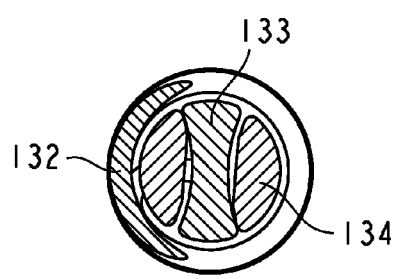
FIG. 43 is a cross-sectional view of the contact probe of FIG. 41, taken at the mid-point of the contact probe's length, as indicated by the lines 43-43 of FIG. 41.
Figure 42:
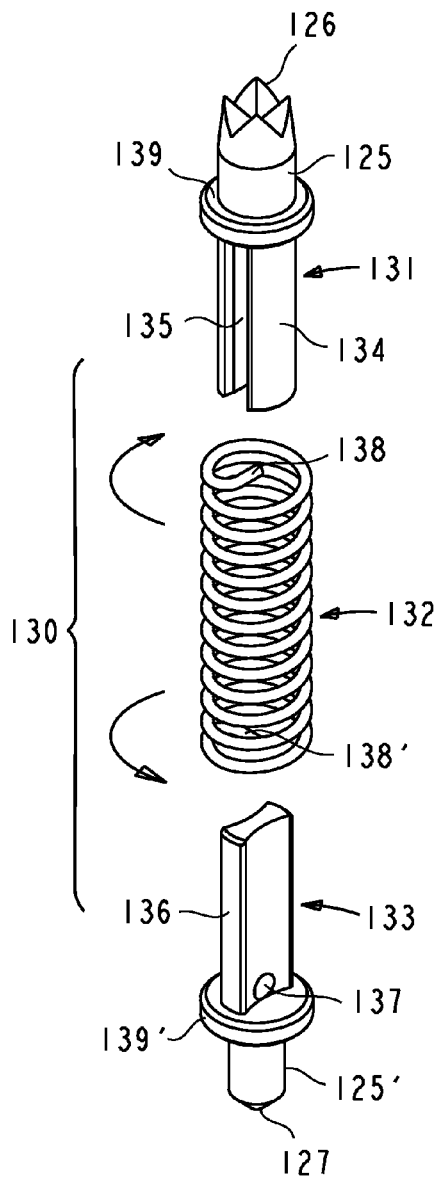
FIG. 42 is an exploded perspective view of the contact probe of FIG. 41.

FIGS. 41-43 show a contact probe 130 with a blade-and-slot coupling configuration. The contact probe comprises a first plunger 131, a compression coil spring 132, and a second plunger 133. The first plunger has an inner portion 134 bifurcated by a slot 135. The second plunger comprises a blade-like body 136 having concave sides and a cross-hole 137. The cross-hole may be adapted to receive a hook 138' of the spring. Each plunger further has a collar 139 adapted to support compression of the spring and to retain the contact probe in the insulator housing cavity. The outer portions of the plungers can be similar to those in contact probe 120, and are indicated by the same reference numerals. The plungers are in a slidable but non-rotatable engagement and torsionally biased as shown in FIG. 43. The plungers are attached to the spring by the torsional bias of the spring and can be further enclosed by a thin barrel, such as previously described barrel 110. (If the contact probe further comprises a barrel, the sides of the blade may be straight, rather than concave.)

FIGS. 44-52—Contact Probes with Extension Spring

The contact probes known in the art and those disclosed above use compression coil springs. However, the hermaphroditic plungers of the present invention can also be used with extension springs. The torsional bias principle is applicable to the extension springs, with the direction of the spring winding and the direction of the torsional bias properly considered. If an extension spring is close-wound (i.e., wound without separation between the coils) there may be a force that tends to keep the coils of the extension spring closed. This can provide an internal preload which must be overcome before the coils start to open.

Figure 44:
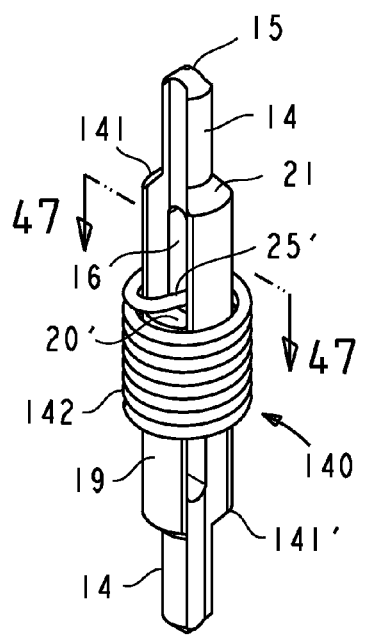
FIG. 44 is a perspective view of a contact probe wherein the plungers are biased by an extension spring.
Figure 45:
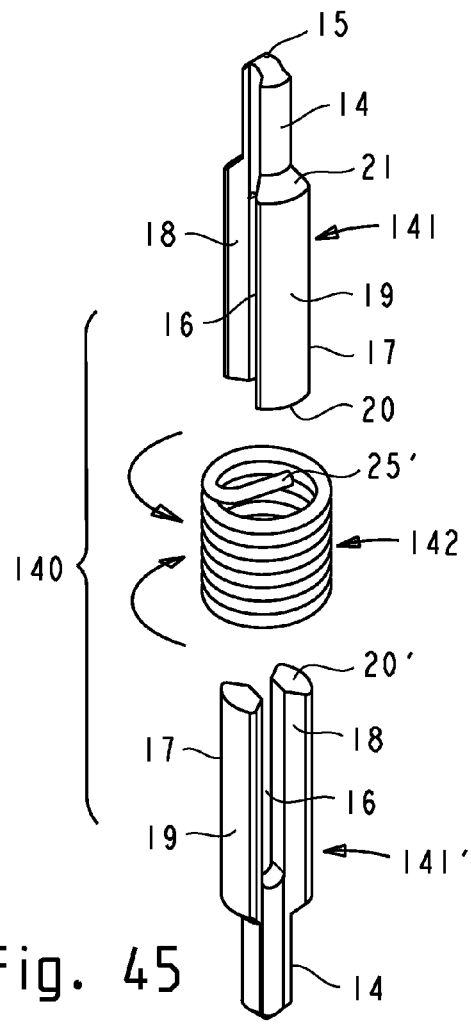
FIG. 45 is an exploded perspective view of the contact probe of FIG. 44.
Figure 47:
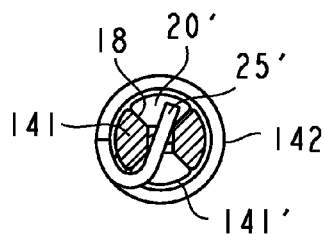
FIG. 47 is a cross-sectional view of the contact probe of FIG. 44 showing spring-to-plunger attachment, the view taken as indicated by the lines 47-47 of FIG. 45.
Figure 46:
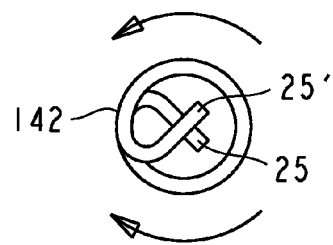
FIG. 46 is a top view of the compression spring wherein the end filars are aligned for entry into the slots of respective plungers.

FIG. 44 shows a contact probe 140, comprising a first plunger 141, an extension coil spring 142, and a second plunger 141'. As in contact probe 10, the plungers are slidably and non-rotatably engaged with each other in a manner that allows the plungers to be brought to a positive conductive contact by a torsional bias of the spring. The components are shown separately in the exploded view of FIG. 45. The plungers are substantially similar to those in contact probe 10, and the corresponding features are designated by the same reference numerals. The spring has a radially and inwardly formed filar 25 at the first end (facing down) and a substantially the same filar 25' at the second end (facing up). In order to engage both plungers with the spring, the filars must be at a substantially right angle to each other as seen in FIG. 45, so that they line up with the slots in the respective plungers. When the plungers are fully inserted into the spring, the inner ends 20 and 20' of the plungers are in contact with the respective filars 25 and 25' of the spring. The spring is twisted and the captivated filars exert a torsional bias against the sides of the slot in each plunger, as shown on the cross-sectional view of FIG. 47. When an axial displacement is applied to the plungers, the inner ends of the plungers press on the respective end filars of the spring, causing the spring to stretch. The extension of the spring provides the axial bias to the plungers.

Figure 48:
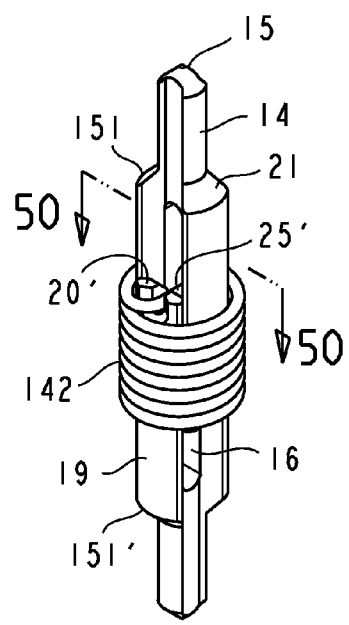
FIG. 48 is a perspective view of a contact probe having plungers biased by an extension spring, wherein the ends of the spring are captivated in grooves on the inner ends of the plungers.
Figure 50:
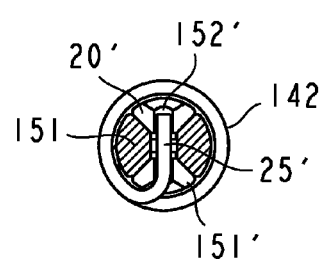
FIG. 50 is a cross-sectional view of the contact probe of FIG. 48 showing spring-to-plunger attachment, taken as indicated by the lines 50-50 of FIG. 48.
Figure 49:
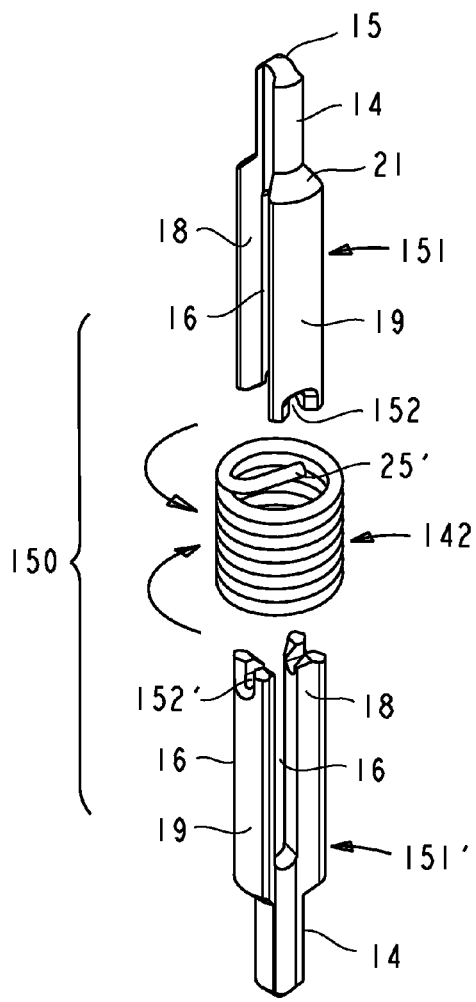
FIG. 49 is an exploded perspective view of the contact probe of FIG. 48.

FIGS. 48-50 show a variation of contact probe 140. A contact probe 150 comprises a first plunger 151, an extension spring 142, and a second plunger 151'. The inner ends 20 of each plunger have grooves 152, which captivate respective end filar 25 of the spring. The filar can be affixed to at least one of the plunger inner ends, e.g., by an interference fit or laser welding (not shown).

Figure 51:
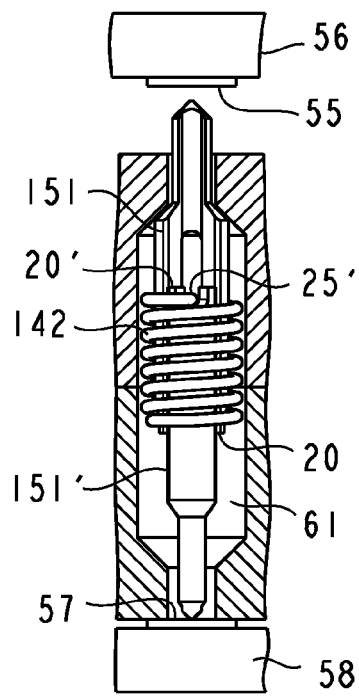
FIG. 51 is a cross-sectional detail of an interposer connector, showing the probe of FIG. 48 assembled in a cavity of an insulative housing and preloaded against an LGA terminal of the second device.
Figure 52:
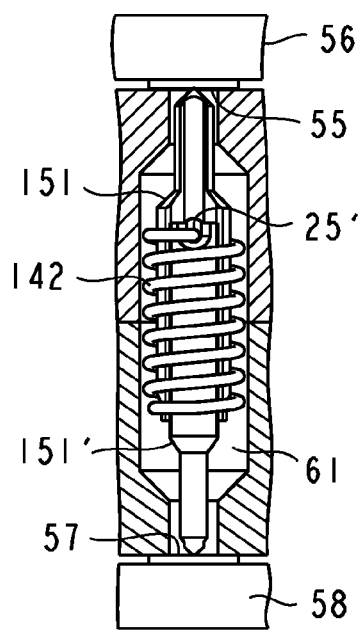
FIG. 52 is a cross-sectional detail of an interposer connector, showing the probe of FIG. 48 assembled in a cavity of an insulative housing and fully compressed between a terminal of the first device and the oppositely disposed terminal of the second device.

FIGS. 51-52 are partial cross-sectional views of an interposer connector, showing insulator cavity details for contact probes having an extension spring. FIG. 51 shows contact probe 150 assembled in a cavity of an insulative housing and preloaded against terminal 63 of device 64. The second plunger is axially displaced and exerts a contact force against the second terminal. In FIG. 52, the first plunger is also displaced by mating with terminal 61 of device 62, and the extension spring is fully extended.

FIGS. 53-56—Contact Probes with Stamped U-Shaped Plungers

Plungers with hermaphroditic coupling means can also be fabricated by forming a drawn profiled wire into a U-shaped configuration. The contact probes using U-shaped plungers can have the same features and functionality as the probes disclosed above, thus the same reference numerals are used to identify the corresponding features.

Figure 53:
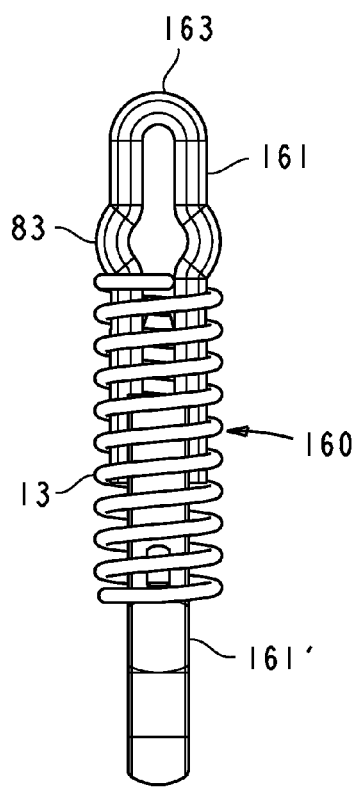
FIG. 53 is a perspective view of a contact probe having stamped U-shaped plungers.

FIG. 53 is a side view of a contact probe 160 comprising a first plunger 161, a compression coil spring 13, and a second plunger 161'. The components are shown separately in the exploded view of FIG. 54. Each plunger has shoulders 83, and detents 162 which form slot narrowing 22. The passage between the detents can be slightly narrower than the diameter of the spring wire, since the tines can resiliently deflect when the filar of the spring is pushed through the detents. The bottom of the "U" forms a rounded tip 163, suitable for connection to an LGA terminal.

Figure 55:
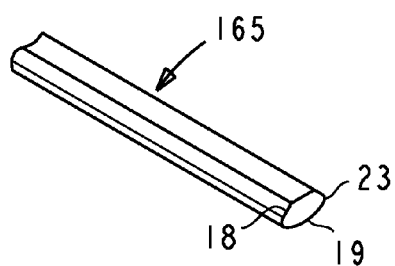
FIG. 55 is a partial perspective view of a profiled wire for making U-shaped plungers.
Figure 54:
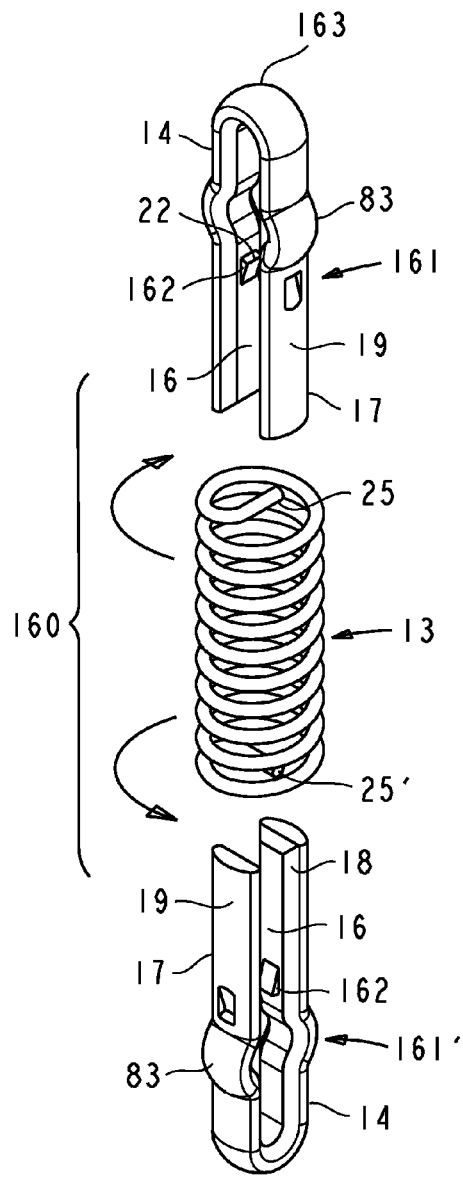
FIG. 54 is an exploded perspective view of the contact probe of FIG. 53.

FIG. 55 shows a profiled wire 165, from which U-shaped plungers can be formed. All essential surface features, such as canted surfaces 18, outside surface 19, and rounds 23, are present in the profiled wire. The shoulders and the detents can be formed in the profiled wire before folding the profiled stock into the U-shaped configuration. Using such profiled stock can be very advantageous for economically producing short contact probes with rounded contact tips.

Figure 56:
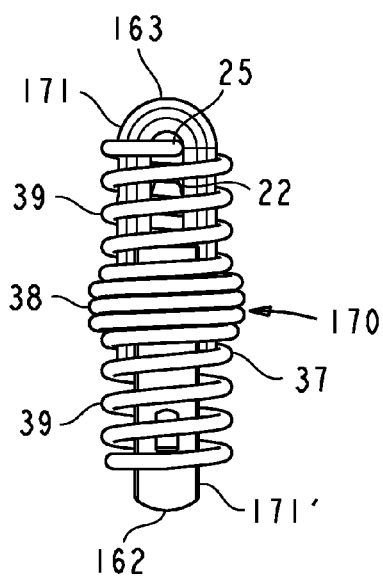
FIG. 56 is a perspective view of a low profile contact probe having stamped U-shaped plungers.
Figure 57:
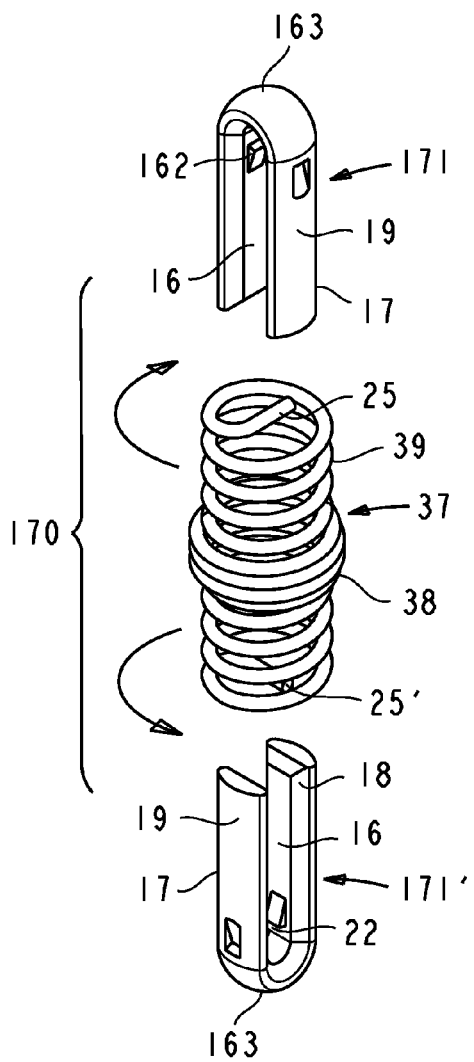
FIG. 57 is an exploded perspective view of the contact probe of FIG. 56.
Figure 58:
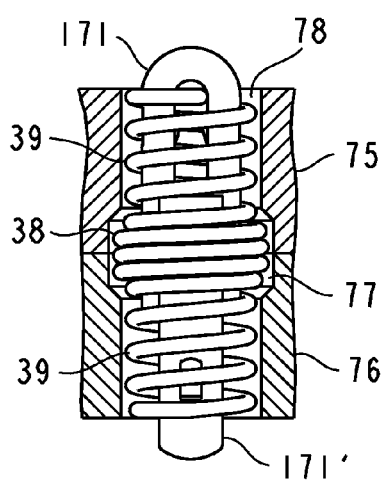
FIG. 58 is a cross-sectional detail of an interposer connector showing a cavity detail for the contact probe of FIG. 56.

FIG. 56 is a side view of a contact probe 170, which is a low profile version of contact probe 160. Contact probe 170 comprises a first plunger 171, a compression coil spring 37, and a second plunger 171'. The components are shown separately in the exploded view of FIG. 57. The spring has diametrically enlarged middle coils 38 which provide a retention means for retaining the contact probe in an insulator cavity as shown in a cross-sectional detail of an interposer connector in FIG. 58. A similar insulator housing cavity is described in more detail in connection with FIG. 24.

Materials and Fabrication

Many material and plating combinations have been useful in electrical contact probes and are applicable to the disclosed designs. The commonly used base metals include: tool steel, stainless steel, and beryllium copper for the plungers; music wire, stainless steel, and beryllium copper for the spring, and brass, beryllium copper, nickel silver, and bronze for the barrel.

Since the conductively coupled plungers provide the primary current path through the contact probe, they can be advantageously made from beryllium copper, which has a higher electrical conductivity than steel. Beryllium copper stock can be mill-hardened or, alternatively, the plungers can be heat treated after fabrication. Plungers are typically plated with about 1.0 µm minimum hard gold over 1-2 µm of electroless nickel. When hardness and durability are very important, the plungers can be made from a tool steel, heat treated, and plated with rhodium, palladium-nickel, or other hard and wear resistant plating, preferably with a low coefficient of friction. The plungers can be further plated with a thin layer of soft gold (e.g., 0.14 µm thick) or treated with a conductive lubricant to enhance the sliding contact and to mitigate galling, in order to increase the contact probe's cycle life.

The plungers can be stamped or screw machined from a profiled stock 30 shown in FIG. 6, or formed from a profiled stock 135 shown in FIG. 55, described in more detail above. Alternatively, the plungers can be machined from a round stock. The feature geometries can be optimized for the chosen fabrication process. For example, end hole 23 can be round in machined contacts, or have a different shape in stamped or formed contacts. Plungers for miniature contact probes will have an overall diametrical dimension of about 1.0 mm or less, but they can also be easily scaled up for use in considerably larger contact probes.

The spring is not a part of the primary current path, and ideally should be electrically insignificant. The spring's material can therefore be selected based on mechanical merits and ease of fabrication. The springs for the miniature probes, having an outside diameter of about 1.0 mm or less, will have best mechanical performance when made from music wire. Beryllium copper can be used when non-magnetic properties are required. Stainless steel can be used when elevated temperature exposure is a consideration. Similarly, the plating of the spring can be primarily focused on the corrosion prevention rather than to assure a good electrical contact. A non-noble plating may be sufficient, or a noble plating can be used sparingly. Alternatively, the spring can be plated with electroless nickel with dispersed Teflon or coated with Parylene (available from Specialty Coating Systems, Indianapolis, Ind., USA), to protect the spring from corrosion, to electrically isolate the spring from the plungers, and to reduce the sliding friction between the spring and the spring guiding surfaces.

In contrast to conventional contact probes, the conductively coupled plungers provide a low resistance current path through the plungers without relying on a barrel. If used, the barrel can therefore be made from nickel silver (Cu—Ni—Zn alloy) and can be used unplated. Nickel silver has an excellent corrosion resistance and can be easily machined from tubular or solid stock or deep drawn.

The insulative housing can be machined or molded from a polymeric material such as polyetheretherketone, polyamide-imide, polyimide, polyphenylene sulfide, polycarbonate, polyester, and alike, which can be reinforced, e.g., with glass fiber.

ADVANTAGES

The disclosed contact probes provide a combination of desirable features not realized in the known art. These include:

(1) Low inductance and low resistance; a torsional bias of the spring is used to establish a direct conductive connection through the plungers, without relying on the spring or a barrel for conductive path.
(2) The torsional bias of the spring provides a predictable contact force between the plungers, which can be controlled by varying the magnitude of the torsional bias. (The conventional contact probes depend on a degraded alignment of components, buckling of the spring, and insulator cavity clearance, for generation of contact forces for conductive coupling between the plungers and the barrel.)
(3) Redundant conductive coupling between the plungers; two lines of contact are established in parallel. (Conventional probes require two connections in series to complete the conductive path; from the first plunger to the barrel, and from the barrel to the second plunger.)
(4) High pointing accuracy; the torsional bias provides a clearance-free sliding engagement between the plungers along two lines of contact, which compels the plungers to remain coaxial. (In conventional probes, plungers make point contacts with the barrel, and there must be a plunger-to-barrel operating clearance to enable plunger tilt. The clearance is determined by the outside diameter of each plunger, the inside diameter of the barrel, and the respective plating thickness variation, and may have a large impact on contact pointing accuracy.)
(5) Direct conductive contact between the plungers makes the spring electrically insignificant; the spring material and plating can be selected based on mechanical merits, without regard to spring material conductivity.
(6) The spring can be coated with a thin layer of insulation to electrically isolate the spring from the plungers, to protect the spring surfaces from corrosion, and/or to reduce friction between the spring and the spring guiding components.
(7) The external coupling surfaces are well defined and can have desired hardness, surface finish, and plating, to assure a predictable friction force and wiping action. (In conventional probes, the contact and friction forces between plungers and the barrel can be erratic since the inside surface of the barrel is relatively soft and can be irregular and difficult to plate consistently.)
(8) The plungers can be economically fabricated from a drawn profiled stock by screw machining or stamping. Both plungers can be fabricated from the same profiled stock, thus providing closely controlled hermaphroditic coupling features. (Conventional plungers are made from around stock and are not amenable to fabrication by stamping.)
(9) Essential plunger features can be prefabricated in a drawn profiled stock with a high degree of dimensional accuracy and reproducibility. A drawn profiled stock can provide surface features, such as small edge rounds, that would be impractical to attain by machining alone.
(10) One piece handling; a three-piece contact probe can be handled as a unit; the plungers can be positively attached to the spring using the torsional bias of the spring. (Conventional three-piece probes do not have a positive attachment mechanism between the plungers and the spring. Four-piece contact probes rely on the barrel to hold the plungers and the spring together.)
(11) The disclosed contact probes can be used where twist-proof contacts are required. The plungers are non-rotatably engaged and the compression of the spring will not cause rotation of the plungers relative to the I/O terminals.
(12) The compression-generated bias is self-cancelling on unloading due to the spring recoil, which helps the plungers to recover to the original extension.
(13) Disclosed contact probes are particularly useful in sizes of about 1 mm, but can be easily scaled up, e.g., to provide larger contacts for heavy duty use, high current capability, or other special applications.

Ramifications and Scope

While the contact probes and connectors have been described by means of specific embodiments, numerous modifications and variations known to those skilled in the art or disclosed may be employed without departing from the scope of the invention set forth in the claims.

For example:

(1) Plungers with hermaphroditic coupling means can provide significant performance and fabrication advantages when used with a minimal torsional bias, or even without torsional bias. The plungers may be attached to the spring using a twist of the spring, while relying primarily on the compression generated bias for conductive coupling.
(2) The canted surfaces are shown flat, but can also be curved.
(3) In longer contact probes, where the plunger tines are long enough to be flexible, a slight interference between the coupling surfaces can provide a resilient conductive coupling between the plungers without torsional bias.
(4) Many contact probe components from different embodiments are intermatable and can be used interchangeably.
(5) Additional insulating components, such as dielectric washers and sleeves, can be added to insulate the spring from the plungers and thus make the spring electrically unnoticed.

As to every element, it may be replaced by one of multiple equivalent alternatives, only some of which are disclosed in the specification. Thus the scope should be determined, not by the examples or specifics given, but by the appended claims and their legal equivalents.

I claim:

1. An electrical contact probe for use in a connector for connecting a first electrical device to a second electrical device, the contact probe comprising:

(a) a first plunger comprising an outer portion having a contact tip adapted for making a conductive connection to an input/output terminal of the first device, and an inner portion having a lengthwise slot and two adjoining tines; each tine having an outside surface, canted surfaces, and coupling surfaces adjoining the outside surface; the inner portion of the first plunger being adapted to slidably and non-rotatably engage a second plunger;

(b) the second plunger comprising an outer portion having a contact tip adapted for making a conductive connection to an input/output terminal of the second device, and an inner portion having a lengthwise slot and two adjoining tines; each tine having an outside surface, canted surfaces, and coupling surfaces adjoining the outside surface; the inner portion of the second plunger being adapted to slidably and non-rotatably engage the first plunger;

(c) a coil spring having a central axis, a first end, and a second end; the first end being engaged with the inner portion of the first plunger, and the second end being engaged with the inner portion of the second plunger;

wherein the plungers are slidably and non-rotatably coupled to each other, and wherein when the contact probe is compressed between the first device and the second device, the spring provides an axial bias for a conductive connection of the plungers to the respective input/output terminals of the first and the second device.

2. The contact probe of claim 1 wherein the first and the second end of the spring each has a filar formed radially toward the central axis of the spring, each filar being non-rotatably engaged with the slot in the respective plunger.

3. The contact probe of claim 2, wherein the spring is attached to the plungers with a predetermined angle of twist, wherein the predetermined angle of twist is permanently retained by the plungers and provides a torsional bias for a direct conductive coupling between the plungers.

4. The contact probe of claim 2 wherein the slot in each plunger further comprises a narrowing and an end hole, and wherein the spring is twisted between the first end the second end prior to the attachment to the plungers, whereby after the respective filar traverses the narrowing, the torsional action of the spring causes the filar to snap into the end hole, thus positively attaching each end of the spring to the respective plunger.

5. The contact probe of claim 3, wherein the predetermined angle of twist between the first and the second ends of the spring is less than 90 degrees.

6. The contact probe of claim 3, wherein the predetermined angle of twist is in the spring winding direction.

7. The contact probe of claim 3, wherein the predetermined angle of twist is in the spring unwinding direction.

8. The contact probe of claim 3, wherein the coil spring is a compression spring, and wherein the filars bear on the edges at the closed end of the respective plunger slots when the spring is axially compressed.

9. The contact probe of claim 2, wherein each tine has an inner end, and the coil spring is an extension spring, and wherein the filars bear on the inner ends of the respective plunger tines when the spring is axially extended.

10. The contact probe of claim 9 wherein the inner end of each tine has a groove, the grooves adapted to captivate the respective filar of the spring.

11. The contact probe of claim 9 wherein the filars are attached to the inner ends of the respective tines.

12. The contact probe of claim, 1 wherein each tine further comprises edge rounds, and wherein the canted surfaces, the edge rounds, and the outside surfaces are substantially preformed in a drawn profiled stock from which the plunger is subsequently made by one or more processes selected from the group consisting of stamping, screw machining, machining, abrasive machining, and electromachining.

13. The contact probe of claim, 1 wherein the plungers are fabricated by forming a drawn profiled stock into a U-shaped configuration, wherein the bottom of the U provides a rounded contact tip.

14. The contact probe of claim 1, wherein the contact probe has a central axis and two diagonal planes passing through the central axis; the tines of each plunger occupying respective quadrants formed by the diagonal planes, wherein in an unbiased state, the coupling surfaces are separated from the diagonal planes by a small clearance so that the plungers can be slidably and non-rotatably coupled without interference, and wherein when a torsional bias is applied to the plungers, the coupling surfaces adjoining one of the diagonal planes are brought to a conductive contact.

15. The contact probe of claim 12, wherein the included angle between the canted surfaces is greater than 90 degrees, so that the first and the second plunger make conductive contacts substantially at the edge rounds.

16. The contact probe of claim 1 wherein the coil spring has a middle portion and end portions, the middle portion comprising coils having a larger outside diameter than the outside diameter of the end portions, and wherein the coils of the middle portion of the spring form a retention collar suitable for retaining the contact probe in an insulator housing cavity.

17. The contact probe of claim 1 wherein the outside surfaces of the first and the second plunger are substantially cylindrical.

18. An electrical contact probe for use in a connector for connecting a first electrical device to a second electrical device, the contact probe comprising:

(a) a first plunger comprising an outer portion having a contact tip adapted for making a separable conductive connection to an input/output terminal of the first device; and an inner portion comprising a lengthwise slot and two adjoining tines, each tine having an outside surface, canted surfaces, and coupling surfaces adjoining the outside surface; the inner portion of the first plunger being adapted to non-rotatably engage a second plunger;

(b) the second plunger comprising an outer portion adapted for making a conductive connection to an input/output terminal of the second device; and an inner portion having outside surfaces, canted surfaces, and coupling surfaces adjoining the outside surfaces; the inner portion of the second plunger being adapted to non-rotatably engage the first plunger;

(c) a coil spring having a central axis, a first end, and a second end; the first end being engaged with the inner portion of the first plunger, and the second end being engaged with the inner portion of the second plunger;

wherein the plungers are slidably and non-rotatably coupled with each other, and wherein when the probe is compressed between the first device and the second device, the spring provides an axial bias for a conductive connection of the plungers to the respective input/output terminals of the first and the second device.

19. The contact probe of claim 18 wherein the coil spring is a compression spring and wherein the first and the second end of the spring each has a hook formed radially and inwardly toward the central axis of the spring, each hook cooperating with the inner portion of the respective plunger to non-rotatably engage the first and the second ends of the spring to the respective plungers; and wherein the spring is twisted a predetermined angle when it is attached to the plungers, and wherein the predetermined angle of twist is retained by the plungers and provides a torsional bias for a direct conductive coupling between the plungers.

20. The contact probe of claim 19 wherein the inner portion of at least one plunger has a trap hole adapted to retentively captivate the respective hook of the spring.

21. The contact probe of claim 19 wherein the inner portion of at least one plunger comprises an undercut adapted to retentively captivate the respective hook of the spring.

22. The contact probe of claim 18 wherein the first and the second end of the spring each has end coils having a predetermined inside diameter and each plunger has a diametrically enlarged portion, wherein the diametrically enlarged portion has a diameter greater than the predetermined inside diameter of the end coils, so that when the plungers are pressed into the respective end coils, the ends of the spring are non-rotatably attached to the respective plungers by an interference fit.

23. The contact probe of claim 18 wherein the first and the second end of the spring each has closely wound end coils, and wherein the end coils are bonded to the bodies of the respective plungers by a bonding method selected from the group consisting of adhesive bonding, reflow soldering, and laser welding.

24. The contact probe of claim 18, wherein the coil spring has an insulating coating, wherein the coating insulates the spring from the plungers.

25. The contact probe of claim 18, wherein at least a portion of the spring has closely wound coils.

26. The contact probe of claim 18 wherein the outer portion of the second plunger comprises an elongated tail suitable for mounting in a plated-through hole of a printed circuit board or for plugging into a socket.

27. The contact probe of claim 18 wherein at least one plunger has substantially arcuate shoulders formed outwardly in the radial direction in a slotted portion of the plunger, wherein the shoulders provide retention means for retaining the contact probe in an insulator housing cavity.

28. The contact probe of claim 18 wherein the contact probe further comprises a thin-wall tubular barrel, which has inwardly rolled ends; the rolled ends retaining the plungers and the spring in the barrel, and providing a retention means for retaining the contact probe in an insulator housing cavity.

29. The contact probe of claim 18, wherein the the inner portion of the second plunger has a solid blade configuration.

30. An electrical connector for connecting a first electrical device having a first array of input/output terminals to a second electrical device having a second array of input/output terminals; the second array being opposite and complementary to the first array; the connector comprising:
(a) a dielectric housing having a plurality of cavities, the cavities arranged in an array complementary to the arrays of the first and second arrays of the input/output terminals; each cavity adapted to accommodate a contact probe;
(b) a plurality of contact probes, each contact probe received in a respective cavity of the dielectric housing; each contact probe comprising:
a first plunger comprising an outer portion having a contact tip adapted for making a separable conductive connection to an input/output terminal of the first device; and an inner portion having a lengthwise slot and two adjoining tines, each tine having an outside surface, canted surfaces, and coupling surfaces adjoining the outside surface; the inner portion of the first plunger being adapted to non-rotatable engage a second plunger;
a second plunger comprising an outer portion adapted for making a conductive connection to an input/output terminal of the second device; and an inner portion having outside surfaces, canted surfaces, and coupling surfaces adjoining the outside surfaces; the inner portion of the second plunger being adapted to non-rotatably engage the first plunger;
a coil spring having a first end adapted to non-rotatably engage the inner portion of the first plunger, and a second end adapted to non-rotatably engage the inner portion of the second plunger;
wherein the inner portion of the first plunger is slidably and non-rotatably coupled with the inner portion of the second plunger; and wherein the spring provides a torsional bias for a direct conductive coupling between the plungers, and, when the probe is compressed between the first device and the second device, the spring further provides an axial bias for a conductive connection between the respective input/output terminals of the first device and the second device.

31. The connector of claim 30 wherein each contact probe further has a retention means adapted to retain the contact probe in the insulator housing cavity, and each cavity comprises an inner opening, retaining surfaces, and outer openings, wherein: the inner opening accommodates the inner portions of the plungers and the spring; the outer openings guide the respective outer portions of the plungers; and the retaining surfaces cooperate with the corresponding retention means in the contact probe to retain the contact probe in the insulator housing cavity.

32. The connector of claim 30 wherein the coil spring has a middle portion and end portions, the middle portion comprising coils having a larger outside diameter than the outside diameter of the end portions, and wherein each cavity comprises an inner opening, retaining surfaces, and outer openings, and wherein: the inner opening accommodates the middle portion of the spring, the outer openings accommodate and guide the respective outer portions of the spring, and the retaining surfaces cooperate with the coils of the middle portion of the spring to retain the contact probe in the insulator housing cavity.

33. An electrical contact probe for use in a connector for connecting a first electrical device to a second electrical device, the contact probe comprising:
(a) a first plunger comprising an outer portion having a contact tip adapted for making a conductive connection to an input/output terminal of the first device; and an inner portion having a lengthwise slot and two adjoining tines adapted to slidably and non-rotatably engage a second plunger;
(b) the second plunger comprising an outer portion having a contact tip adapted for making a conductive connection to an input/output terminal of the second device; and an inner portion having a lengthwise slot and two adjoining tines adapted to slidably and non-rotatably engage the first plunger;
(c) a coil spring having a central axis, a first end, and a second end; wherein the first and the second end of the spring each has a filar formed radially toward the central axis of the spring, each filar being non-rotatably engaged to the slot in the respective plunger;
wherein the plungers are slidably and non-rotatably coupled with each other, and wherein when the contact probe is compressed between the first device and the second device, the filars bear on the edges at the closed end of the respective plunger slots, and the spring provides an axial bias for a conductive connection of the plungers to the respective input/output terminals of the first and the second device.

34. The contact probe of claim 33, wherein the spring is attached to the plungers with a predetermined angle of twist, wherein the predetermined angle of twist is permanently retained by the plungers and provides a torsional bias for a direct conductive coupling between the plungers.

35. The contact probe of claim 33 wherein the slot in each plunger further comprises a detent, and wherein the spring is twisted between the first and the second end prior to the attachment to the plungers, whereby after the respective filar traverses the detent, the torsional action of the spring causes the filar to snap behind the detent, thus positively attaching each end of the spring to the respective plunger.

36. An electrical contact probe for use in a connector for connecting a first electrical device to a second electrical device, the contact probe comprising:
   (a) a first plunger comprising an outer portion having a contact tip adapted for making a conductive connection to an input/output terminal of the first device; and an inner portion having a lengthwise slot and two adjoining tines adapted to slidably and non-rotatably engage a second plunger;
   (b) the second plunger comprising an outer portion having a contact tip adapted for making a conductive connection to an input/output terminal of the second device; and an inner portion adapted to slidably and non-rotatably engage the first plunger;
   (c) a compression coil spring having a first end adapted to non-rotatably engage the inner portion of the first plunger, and a second end adapted to non-rotatably engage the inner portion of the second plunger; the spring being attached to the plungers with a predetermined angle of twist between the first end and the second end, wherein the predetermined angle of twist is permanently retained by the plungers and provides a torsional bias for a direct conductive coupling between the plungers;

wherein the plungers are slidably and non-rotatably coupled with each other, and wherein when the contact probe is compressed between the first device and the second device, the spring further provides an axial bias for a conductive connection of the plungers to the respective input/output terminals of the first and the second device.

* * * * *